United States Patent
Lee et al.

(10) Patent No.: US 12,477,822 B2
(45) Date of Patent: Nov. 18, 2025

(54) THREE-DIMENSIONAL SEMICONDUCTOR DEVICE AND METHOD OF MANUFACTURING THE SAME

(71) Applicant: SAMSUNG ELECTRONICS CO., LTD., Suwon-si (KR)

(72) Inventors: Kyen-Hee Lee, Suwon-si (KR); Kyungsoo Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 304 days.

(21) Appl. No.: 18/134,853

(22) Filed: Apr. 14, 2023

(65) Prior Publication Data

US 2023/0361119 A1    Nov. 9, 2023

(30) Foreign Application Priority Data

May 3, 2022    (KR) ........................ 10-2022-0054686

(51) Int. Cl.
*H10D 84/85*    (2025.01)
*H10D 30/01*    (2025.01)
(Continued)

(52) U.S. Cl.
CPC ......... *H10D 84/856* (2025.01); *H10D 30/014* (2025.01); *H10D 30/43* (2025.01);
(Continued)

(58) Field of Classification Search
CPC ...... H10D 88/00; H10D 88/01; H10D 64/256; H10D 64/017; H10D 30/014;
(Continued)

(56) References Cited

U.S. PATENT DOCUMENTS 11,239,236 B2    2/2022 Lilak et al.
2017/0358356 A1*    12/2017 Lee .................... G11C 16/0483
(Continued)

FOREIGN PATENT DOCUMENTS

DE    102020131432 A1    11/2021

OTHER PUBLICATIONS

Communication dated Aug. 19, 2025 issued by the Korean Intellectual Property Office in Korean Patent Application No. 10-2022-0054686.

*Primary Examiner* — Mohsen Ahmadi
(74) *Attorney, Agent, or Firm* — Sughrue Mion, PLLC

(57) ABSTRACT

Disclosed are three-dimensional semiconductor devices and their fabrication methods. The 3D semiconductor device includes a first active region on a substrate and including a lower channel pattern and a lower source/drain pattern connected to the lower channel pattern, a second active region above the first active region and including an upper channel pattern and an upper source/drain pattern connected to the upper channel pattern, at least one gate electrode on the lower and upper channel patterns, a first active contact electrically connected to the lower source/drain pattern, and a second active contact electrically connected to the upper source/drain pattern. A first central line of the lower source/drain pattern and a second central line of the upper source/drain pattern in a vertical direction are offset from each other in a first direction perpendicular to the vertical direction. The first active contact and the second active contact are spaced apart from each other in the first direction.

18 Claims, 51 Drawing Sheets

(51) Int. Cl.
*H10D 30/43* (2025.01)
*H10D 30/67* (2025.01)
*H10D 62/10* (2025.01)
*H10D 62/13* (2025.01)
*H10D 62/17* (2025.01)
*H10D 64/01* (2025.01)
*H10D 64/23* (2025.01)
*H10D 84/01* (2025.01)
*H10D 84/03* (2025.01)
*H10D 84/83* (2025.01)
*H10D 88/00* (2025.01)

(52) U.S. Cl.
CPC ..... *H10D 30/6729* (2025.01); *H10D 30/6735* (2025.01); *H10D 62/121* (2025.01); *H10D 84/0167* (2025.01); *H10D 84/017* (2025.01); *H10D 84/0186* (2025.01); *H10D 84/038* (2025.01); *H10D 88/01* (2025.01)

(58) Field of Classification Search
CPC ........... H10D 30/6757; H10D 30/6735; H10D 30/43; H10D 84/013; H10D 84/038; H10D 62/121; H10D 62/364; H10D 62/151

See application file for complete search history.

(56) References Cited

U.S. PATENT DOCUMENTS

| | | | |
|---|---|---|---|
| 2019/0304993 A1* | 10/2019 | Lee | H10B 43/27 |
| 2019/0305095 A1* | 10/2019 | Choi | H10B 43/10 |
| 2020/0083340 A1 | 3/2020 | Wu et al. | |
| 2020/0203341 A1 | 6/2020 | Barraud et al. | |
| 2020/0235222 A1* | 7/2020 | Noh | H10D 64/017 |
| 2020/0335501 A1 | 10/2020 | Dewey et al. | |
| 2021/0036014 A1* | 2/2021 | Yang | H10B 43/10 |
| 2021/0091093 A1* | 3/2021 | Kanamori | H10B 43/35 |
| 2021/0328014 A1 | 10/2021 | Reboh et al. | |
| 2021/0349691 A1 | 11/2021 | Hekmatshoartabari et al. | |
| 2021/0366907 A1 | 11/2021 | Liao et al. | |
| 2022/0109046 A1 | 4/2022 | Hong et al. | |

* cited by examiner

THREE-DIMENSIONAL SEMICONDUCTOR DEVICE AND METHOD OF MANUFACTURING THE SAME

CROSS-REFERENCE TO RELATED APPLICATION

This application claims priority to Korean Patent Application No. 10-2022-0054686 filed on May 3, 2022 in the Korean Intellectual Property Office, the disclosure of which is incorporated herein in its entirety by reference.

BACKGROUND

1. Field

The embodiments of the disclosure relate to a three-dimensional semiconductor device and a method of manufacturing the same, and more particularly, to a three-dimensional semiconductor device including a field effect transistor and a method of manufacturing the same.

2. Description of Related Art

A semiconductor device includes an integrated circuit including metal-oxide-semiconductor field-effect-transistors (MOSFETs). As sizes and design rules of the semiconductor device are decreased, sizes of the MOSFETs are also increasingly scaled down. The scale down of MOSFETs may deteriorate operating characteristics of the semiconductor device. Accordingly, various studies have been conducted to develop methods of manufacturing semiconductor devices having improved performances while overcoming limitations caused by high device density of the semiconductor devices.

SUMMARY

Some embodiments of the disclosure provide a three-dimensional semiconductor device with increased reliability and process efficiency as well as improved device density, and a method of manufacturing the same.

According to some embodiments, there is provided a three-dimensional semiconductor device which may include: a first active region on a substrate, the first active region including a lower channel pattern and a lower source/drain pattern connected to the lower channel pattern; a second active region above the first active region, the second active region including an upper channel pattern and an upper source/drain pattern connected to the upper channel pattern; at least one gate electrode on the lower and upper channel patterns; a first active contact electrically connected to the lower source/drain pattern; and a second active contact electrically connected to the upper source/drain pattern. A first central line of the lower source/drain pattern and a second central line of the upper source/drain pattern in a vertical direction may be offset from each other in a first direction perpendicular to the vertical direction. The first active contact and the second active contact may be spaced apart from each other in the first direction.

According to some embodiments, there is provided a three-dimensional semiconductor device which may include: a substrate that includes an active pattern; an upper source/drain pattern above the lower source/drain pattern, the upper source/drain pattern being vertically spaced apart from the lower source/drain pattern, and a first portion of the upper source/drain pattern and a second portion of the lower source/drain pattern vertically overlapping each other while a second portion of the upper source/drain pattern and a first portion of the lower source/drain pattern not vertically overlapping each other; a first interlayer dielectric layer on the lower source/drain pattern and a second interlayer dielectric layer on the upper source/drain pattern; a first active contact that vertically extends from a top surface of the second interlayer dielectric layer through the first and second interlayer dielectric layers to the lower source/drain pattern; and a second active contact that vertically extends from the top surface of the second interlayer dielectric layer through the second interlayer dielectric layer to the upper source/drain pattern. A first central line of the lower source/drain pattern and a second central line of the upper source/drain pattern in a vertical direction may be offset from each other in a first direction perpendicular to the vertical direction. The first active contact and the second active contact may be spaced apart from each other in the first direction. The first active contact may be insulated from the upper source/drain pattern and is electrically connected to the lower source/drain pattern. The second active contact may be insulated from the lower source/drain pattern and is electrically connected to the upper source/drain pattern.

According to some embodiments, there is provided a three-dimensional semiconductor device which may include: lower source/drain patterns connected to each other through a lower channel pattern; and upper source/drain patterns, above the lower source/drain patterns, connected to each other through an upper channel pattern. The lower channel pattern and the upper channel pattern have an equal width in a first direction. A first central line of the lower channel pattern and a second central line of the upper channel pattern in a vertical direction, perpendicular to the first direction, do not overlap each other.

DETAIL DESCRIPTION

Figure 1:
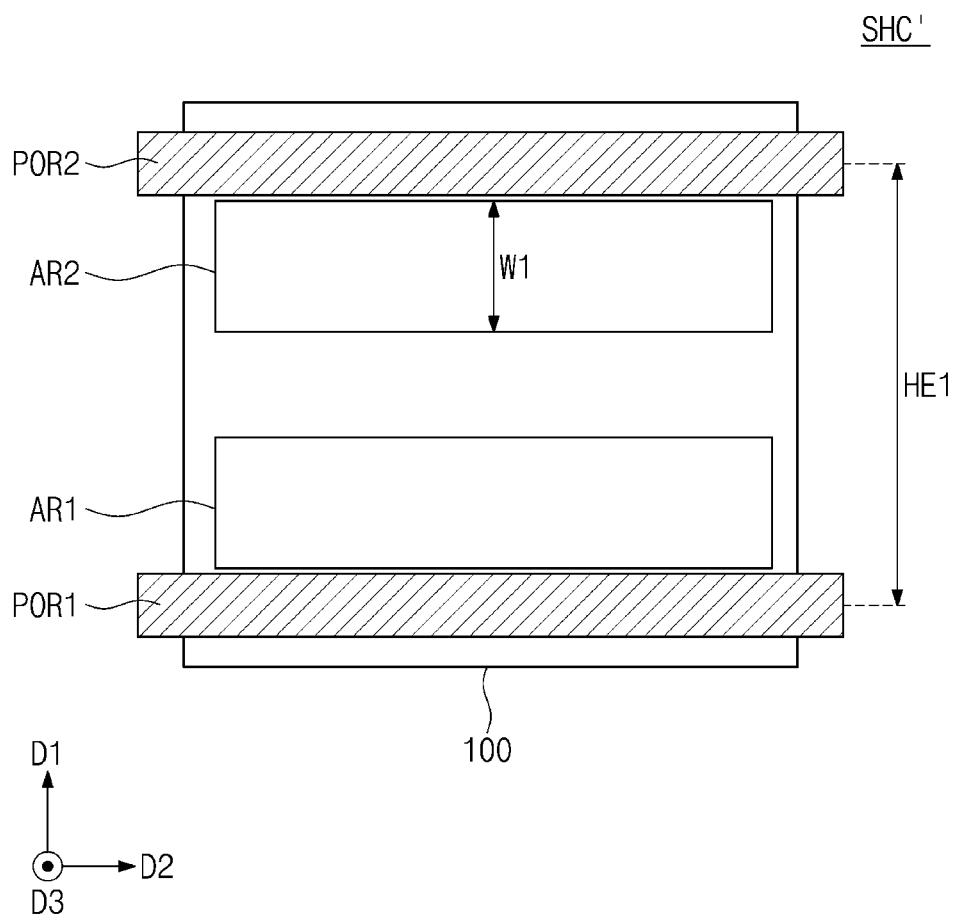
FIG. 1 illustrates a logic cell of a two-dimensional semiconductor device according to an embodiment.

The embodiments of the disclosure described herein are example embodiments, and thus, the disclosure is not limited thereto, and may be realized in various other forms.

Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, nanosheet sacrificial layers, sacrificial isolation layers and channel isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "first" element or a "second" element, respectively, as long as their structural relationship is clearly understood in the context of the descriptions. Similarly, the terms a "lower" element and an "upper" element may be respectively referred to as a "first" element and a "second" element with necessary descriptions to distinguish the two elements.

It will be understood that, although the terms "first," "second," "third," "fourth," etc. may be used herein to describe various elements, these elements should not be limited by these terms. These terms are only used to distinguish one element from another element. Thus, a first element discussed below could be termed a second element without departing from the teachings of the disclosure.

FIG. 1 illustrates a logic cell of a two-dimensional semiconductor device according to an embodiment.

Referring to FIG. 1, a single height cell SHC' may be provided. For example, a substrate 100 may be provided thereon with a first power line POR1 and a second power line POR2. One of the first and second power lines POR1 and POR2 may be provided with a drain voltage (VDD) or a power voltage. The other of the first and second power lines POR1 and POR2 may be provided with a source voltage (VSS) or a ground voltage. For example, the source voltage (VSS) may be applied to the first power line POR1, and the drain voltage (VDD) may be applied to the second power line POR2.

The single height cell SHC' may be defined between the first power line POR1 and the second power line POR2. The single height cell SHC' may include a first active region AR1 and a second active region AR2. One of the first and second active regions AR1 and AR2 may be a p-type metal-oxide-semiconductor field-effect-transistor (PMOS) region, and the other of the first and second active regions AR1 and AR2 may be an n-type metal-oxide-semiconductor field-effect-transistor (NMOS) region. For example, the first active region AR1 may be an NMOS region, and the second active region AR2 may be a PMOS region. For example, the single height cell SHC' may have a complementary metal oxide semiconductor (CMOS) structure provided between the first power line POR1 and the second power line POR2.

A semiconductor device shown in FIG. 1 may be a two-dimensional device in which transistors of a front-end-of-line (FEOL) layer are arranged two-dimensionally. For example, NMOSs of the first active region AR1 may be formed spaced apart in a first direction D1 from PMOSs of the second active region AR2. The first direction D1 represents a channel-width direction, which may be perpendicular to a second direction D2, which represents a channel-length direction in the semiconductor device.

The first and second active regions AR1 and AR2 may each have a substantially equal width, that is, a first width W1, in the first direction D1. A first height HE1 may be defined to indicate a length in the first direction D1 of the single height cell SHC'. The first height HE1 may be substantially equal to a distance (e.g., pitch) between the first power line POR1 and the second power line POR2.

The single height cell SHC' may constitute one logic cell. In this description, the logic cell may mean a logic device, such as AND, OR, XOR, XNOR, and inverter, that performs a specific function. For example, the logic cell may include transistors for constituting a logic device, and may also include wiring lines that connect the transistors to each other.

Because a two-dimensional device is included in the single height cell SHC' as shown in FIG. 1, the first active region AR1 and the second active region AR2 may be disposed spaced apart from each other in the first direction D1 without overlapping each other. Therefore, it may be required that the first height HE1 of the single height cell SHC' be defined to include all of the first and second active regions AR1 and AR2 that are spaced apart from each other in the first direction D1. As a result, the first height HE1 of the single height cell SHC' may have a relatively large area.

Figure 2:
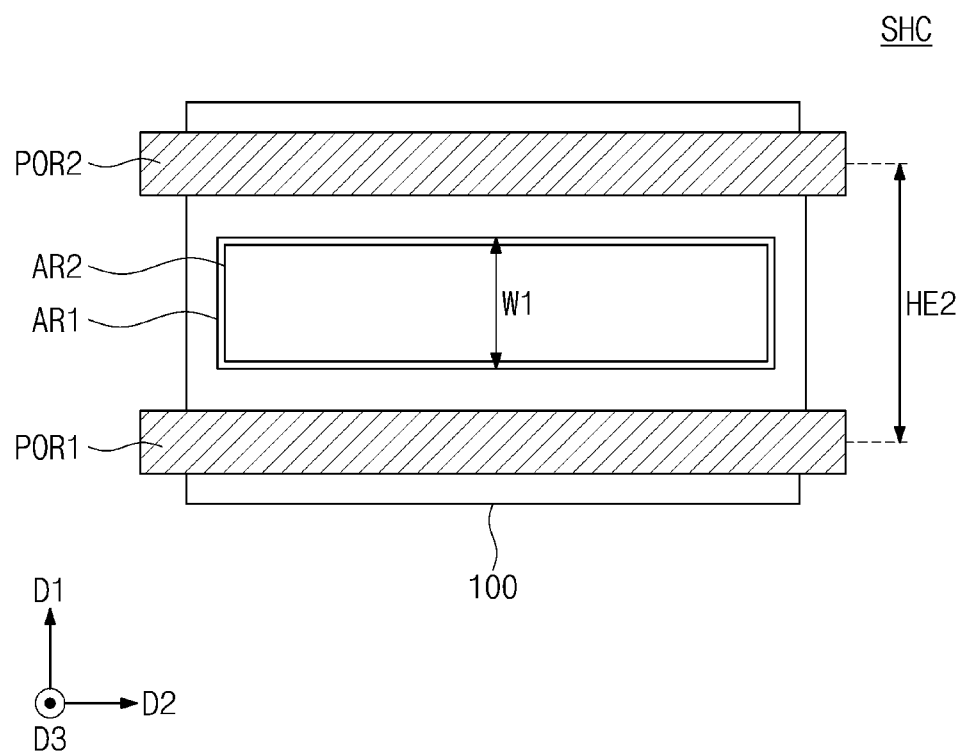
FIG. 2 illustrates a logic cell of a semiconductor device according to some embodiments.

FIG. 2 illustrates a logic cell of a semiconductor device according to some embodiments. FIG. 2 depicts a logic cell of a three-dimensional device according to some embodiments.

Referring to FIG. 2, a single height cell SHC may be provided which includes a three-dimensional device such as a stacked transistor. For example, a substrate 100 may be provided thereon with a first power line POR1 and a second power line POR2. The single height cell SHC may be defined between the first power line POR1 and the second power line POR2.

The single height cell SHC may include a first active region AR1 and a second active region AR2. One of the first and second active regions AR1 and AR2 may be a PMOS region, and the other of the first and second active regions AR1 and AR2 may be an NMOS region.

A semiconductor device according to some embodiments may be a three-dimensional device in which transistors of a front-end-of-line (FEOL) layer are stacked vertically. The substrate 100 may be provided thereon with the first active region AR1 as a lower tier, and the first active region AR1 may be provided thereon with the second active region AR2 as an upper tier. For example, the substrate 100 may be provided thereon with NMOSs of the first active region AR1, and the NMOSs may be provided thereon with PMOSs of the second active region AR2. The first active region AR1 and the second active region AR2 may be spaced apart from each other in a vertical direction or a third direction D3.

The first and second active regions AR1 and AR2 may each have a first width W1 in the first direction D1. A second height HE2 may be defined to indicate a length in the first direction D1 of the single height cell SHC according to the present embodiment.

Because the single height cell SHC according to the present embodiment includes a three-dimensional device or a stacked transistor, the first and second active regions AR1 and AR2 may overlap each other. Therefore, the second height HE2 of the single height cell SHC may have a size greater than the first width W1. As a result, the second height HE2 of the single height cell SHC according to an embodiment may be less than the first height HE1 of the single height cell SHC' discussed above in reference to FIG. 1. For example, the single height cell SHC according to an embodiment may have a relatively small area. Thus, the single height cell SHC including a three-dimensional semiconductor device shown in FIG. 2 may achieve improvement in device density.

Figure 3:
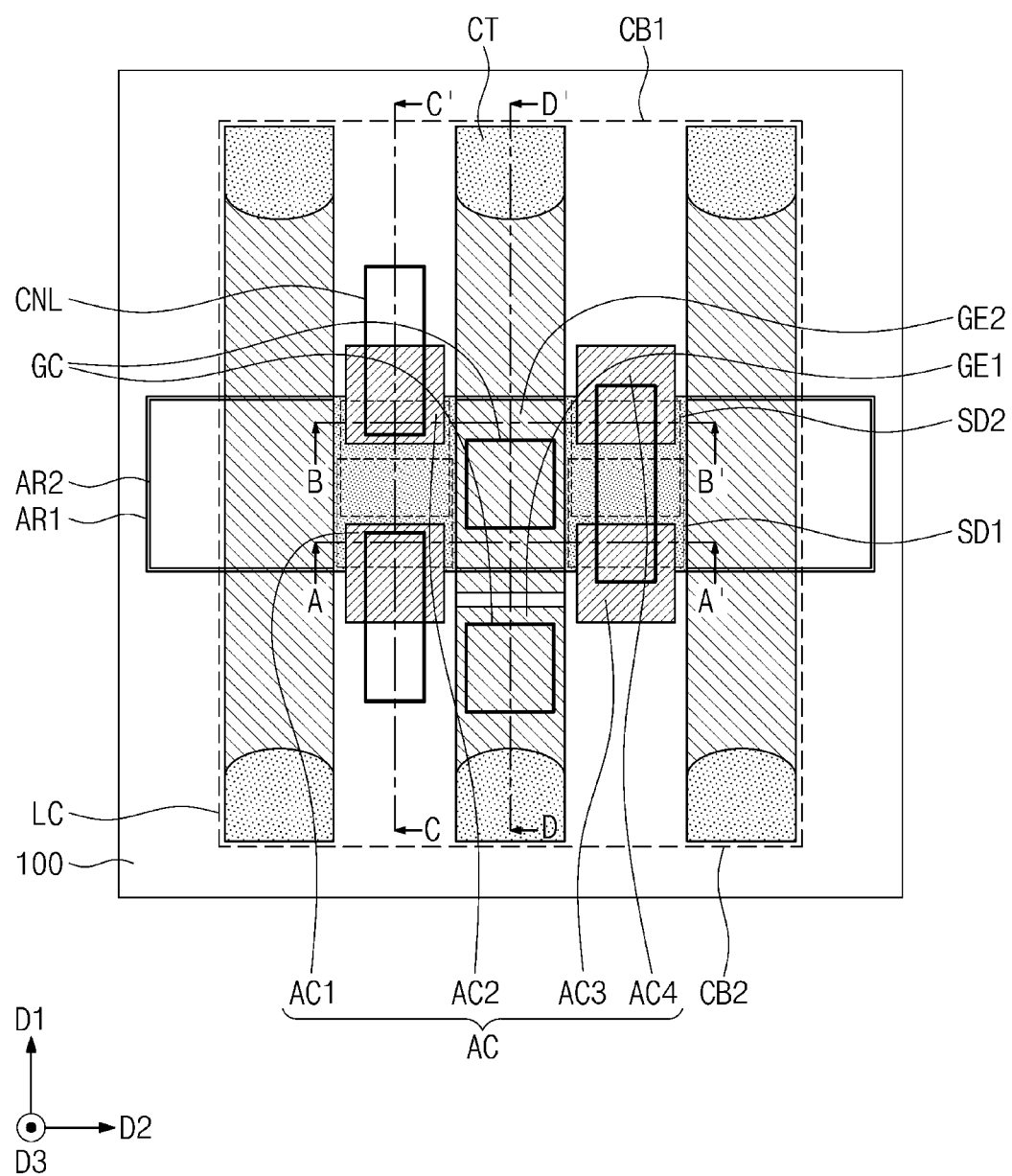
FIG. 3 illustrates a plan view of a three-dimensional semiconductor device, according to some embodiments.
Figure 4A:
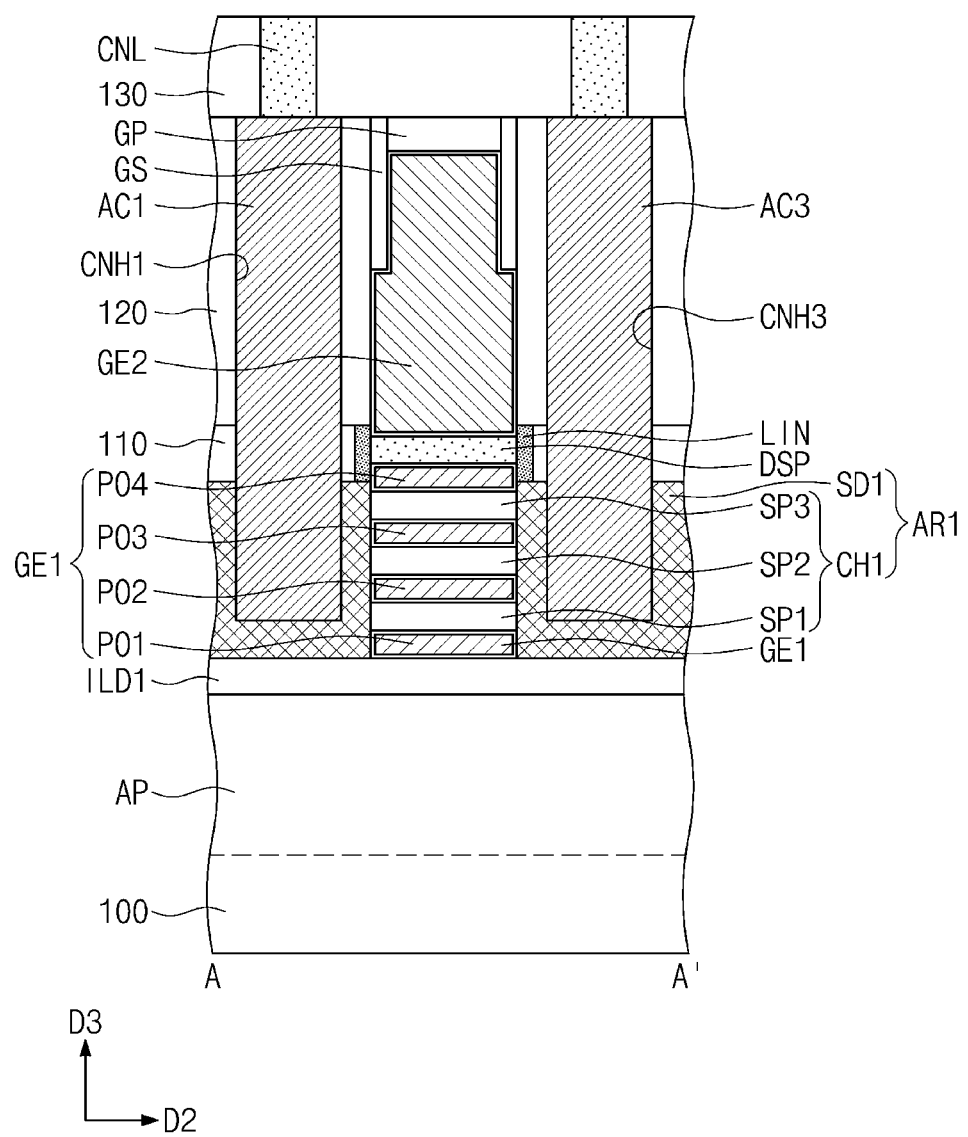
FIGS. 4A, 4B, 4C, and 4D illustrate cross-sectional views respectively taken along lines A-A', B-B', C-C', and D-D' of FIG. 3.

FIG. 3 illustrates a plan view of a three-dimensional semiconductor device, according to some embodiments. FIGS. 4A, 4B, 4C, and 4D illustrate cross-sectional views respectively taken along lines A-A', B-B', C-C', and D-D' of FIG. 3. FIG. 4E illustrates an enlarged view showing section S depicted in FIG. 4D. A three-dimensional semiconductor device illustrated in FIGS. 3 and 4A to 4E is an example of the single height cell shown in FIG. 2.

Referring to FIGS. 3 and 4A to 4E, a logic cell LC may be provided on a substrate 100. The substrate 100 may be a compound semiconductor substrate or a semiconductor substrate including silicon, germanium, or silicon-germanium. For example, the substrate 100 may be a silicon substrate.

The logic cell LC may include a first active region AR1 and a second active region AR2 that are sequentially stacked on the substrate 100. One of the first and second active regions AR1 and AR2 may be a PMOS region, and the other of the first and second active regions AR1 and AR2 may be an NMOS region. The first active region AR1 may be provided on a bottom tier of a front-end-of-line (FEOL) layer, and the second active region AR2 may be provided on a top tier of a front-end-of-line (FEOL) layer. An NMOS and a PMOS on the first and second active regions AR1 and AR2 may be vertically stacked to constitute a three-dimensional stacked transistor. According to an embodiment, the first active region AR1 may be an NMOS region, and the second active region AR2 may be PMOS region.

An active pattern AP may be defined by a trench TR formed on an upper portion of the substrate 100. The active pattern AP may be a vertically protruding portion of the substrate 100. When viewed in plan, the active pattern AP may have a bar shape that extends in the second direction D2. The active pattern AP may be provided thereon with the first and second active regions AR1 and AR2 that are sequentially stacked.

The trench TR may be filled with a device isolation layer ST. The device isolation layer ST may include a silicon oxide layer. The device isolation layer ST may have a top surface at a level of or lower than a top surface of the active pattern AP. The device isolation layer ST may not be formed on any of lower and upper channel patterns CH1 and CH2 which will be discussed below. In an embodiment, a dielectric layer ILD1 may be provided on the device isolation layer ST. The dielectric layer ILD1 may be omitted in the semiconductor device.

The active pattern AP may be provided thereon with the first active region AR1 that includes a lower channel pattern CH1 and a pair of lower source/drain patterns SD1. The lower channel pattern CH1 may be interposed between the pair of lower source/drain patterns SD1. The lower channel pattern CH1 may connect the pair of lower source/drain patterns SD1 to each other.

The lower channel pattern CH1 may include first, second, and third semiconductor patterns SP1, SP2, and SP3 that are sequentially stacked. The first, second, and third semiconductor patterns SP1, SP2, and SP3 may be spaced apart from each other in a vertical direction or a third direction D3. The first, second, and third semiconductor patterns SP1, SP2, and SP3 may each include one or more of silicon (Si), germanium (Ge), and silicon-germanium (SiGe). For example, each of the first, second, and third semiconductor patterns SP1, SP2, and SP3 may include crystalline silicon. FIGS. 4A, 4D and 4E shown the lower channel pattern CH1 includes three channel patterns of the first, second, and third semiconductor patterns SP1, SP2, and SP3. However, the lower channel pattern CH1 may be formed of a different number of channel patterns, according to embodiments.

The lower source/drain patterns SD1 may be provided on the top surface of the active pattern AP. Each of the lower source/drain patterns SD1 may be an epitaxial pattern formed by a selective epitaxial growth process. For example, the lower source/drain pattern SD1 may have a top surface at a level higher than a top surface of the third semiconductor pattern SP3 of the lower channel pattern CH1.

The lower source/drain patterns SD1 may be doped with impurities to have a first conductivity type. The first conductivity type may be of an n-type or p-type. In the present embodiment, the first conductivity type may be an n-type. The lower source/drain patterns SD1 may include one or more of silicon (Si) and silicon-germanium (SiGe). The n-type dopants may include one or more of phosphorus (P), arsenic (As), antimony (Sb), etc.

A first interlayer dielectric layer 110 may be provided on the lower source/drain patterns SD1. The first interlayer dielectric layer 110 may cover the lower source/drain patterns SD1, for example. The first interlayer dielectric layer 110 may be provided thereon with a second interlayer dielectric layer 120 and the second active region AR2.

The second active region AR2 may include a second channel pattern CH2 and a pair of second source/drain patterns SD2. The second source/drain patterns SD2 may have their first portions SD2_P1 that vertically overlap corresponding second portions SD1_P2 of the first (lower) source/drain patterns SD1. Herebelow, the second channel pattern CH2 and the second source/drain patterns SD2 are referred to as an upper channel pattern CH2 and upper source/drain patterns SD2, respectively, for description convenience.

Referring back to FIG. 4C, the lower source/drain pattern SD1 may include a first edge portion EG1 (or a left side edge or surface) and a second edge portion EG2 (or a right side edge or surface). The upper source/drain pattern SD2 may include a third edge portion EG3 (or a left side edge or surface) and a fourth edge portion EG4 (or a right side edge or surface). The first edge portion EG1 may be directly connected to a first active contact AC1 which will be discussed below. The fourth edge portion EG4 may be directly connected to a second active contact AC2 which will be discussed below. For example, the second edge portion EG2 and the third edge portion EG3 may not be directly connected to the first active contact AC1 and the second active contact AC2, respectively. The first portion SD2_P1 of the upper source/drain pattern SD2 may include the third edge portion EG3. The second portion SD1_P2 of the lower source/drain pattern SD1 may include the second edge portion EG2.

The lower source/drain pattern SD1 may include a first central line C1 in the third direction D3, and the upper source/drain pattern SD2 may include a second central line C2 in the third direction D3. The first central line C1 may be a boundary line by which a cross section of the lower source/drain pattern SD1 is divided into equal areas in a first direction D1, and the second central line C2 may be a boundary by which a cross section of the upper source/drain pattern SD2 is divided into equal areas in the first direction D1. The first central line C1 of the lower source/drain pattern SD1 may be offset in the first direction D1 from the second central line C2 of the upper source/drain pattern SD2. Therefore, the first portions SD2_P1 of the upper source/drain patterns SD2 may vertically overlap corresponding second portions SD1_P2 of the lower source/drain patterns SD1. In addition, the first and second central lines C1 and C2 may be offset from each other in the first direction D1 to allow the first active contact AC1 and the third edge portion EG3 to separate from each other.

The upper channel pattern CH2 may be interposed between the pair of upper source/drain patterns SD2. The upper channel pattern CH2 may connect the pair of upper source/drain patterns SD2 to each other. A first portion CH2_P1 of the upper channel pattern CH2 may vertically overlap a second portion CH1_P2 of the lower channel pattern CH1.

Referring back to FIGS. 4D and 4E, the lower channel pattern CH1 may include a third central line C3 in the third direction D3, and the upper channel pattern CH2 may include a fourth central line C4 in the third direction D3. The third central line C3 may be a boundary line by which a cross section of the lower channel pattern CH1 is divided into equal areas in the first direction D1, and the fourth central line C4 may be a boundary line by which a cross section of the upper channel pattern CH2 is divided into equal areas in the first direction D1. The third central line C3 of the lower channel pattern CH1 may be offset in the first direction D1 from the fourth central line C4 of the upper channel pattern CH2. Therefore, the first portions CH2_P1 of the upper channel patterns CH2 may vertically overlap corresponding second portions CH1_P2 of the lower channel patterns CH1.

The first central line C1 of the lower source/drain pattern SD1 and the third central line C3 of the lower channel pattern CH1 may have the same position in the first direction D1. The central line C2 of the upper source/drain pattern SD2 and the fourth central line C4 of the upper channel pattern CH2 may have the same position in the first direction D1. This may be because the lower and upper source/drain patterns SD1 and SD2 may be epitaxially grown from at least the lower and upper channel patterns CH1 and CH2, respectively, by a selective epitaxial growth (SEG) process. In relevant processes, the semiconductor patterns SP1 to SP6 of the lower and upper channel patterns CH1 and CH2 may be used as seed layers to form the lower and upper source/drain patterns SD1 and SD2. For example, the first central line C1 and the third central line C3 may be placed at the same position, and the second central line C2 and the fourth central line C4 may be placed at the same position.

FIG. 4E illustrates an enlarged view showing section S depicted in FIG. 4D. Referring back to FIG. 4E, the lower and upper channel patterns CH1 and CH2 may each have a channel width in the first direction D1. In this case, a first width WD1 may be defined to indicate the width of the lower channel pattern CH1, and a second width WD2 may be defined to indicate the width of the upper channel pattern CH2. The first width WD1 and the second width WD2 may be equal to each other. According to some embodiments, the first width WD1 and the second width WD2 may be different from each other such that first portions of the upper channel patterns CH2 may vertically overlap corresponding second portions of the lower channel patterns CH1. The first width WD1 and the second width WD2 may each be smaller than a width W1 of the active pattern AP on an upper portion of the active pattern AP. For example, a maximum value of each of the first width WD1 and the second width WD2 may be the same as the width W1 of the active pattern AP. The width W1 of the active pattern AP may correspond to the first width W1 shown in FIG. 2.

The upper channel pattern CH2 may include fourth, fifth, and sixth semiconductor patterns SP4, SP5, and SP6 that are sequentially stacked. The fourth, fifth, and sixth semiconductor patterns SP4, SP5, and SP6 may be spaced apart from each other in the third direction D3. The fourth, fifth, and sixth semiconductor patterns SP4, SP5, and SP6 may include the same material as the first, second, and third semiconductor patterns SP1, SP2, and SP3 of the lower channel pattern CH1. FIGS. 4A, 4D and 4E shown the upper channel pattern CH2 includes three channel patterns of the fourth, fifth, and sixth semiconductor patterns SP4, SP5, and SP6. However, the upper channel pattern CH2 may be formed of a different number of channel patterns, according to embodiments. The upper channel pattern CH2 and the lower channel pattern CH1 may be formed of a different number of channel patterns, according to embodiments.

At least one dummy channel pattern DSP may be interposed between the lower channel pattern CH1 and the upper channel pattern CH2 that overlies the lower channel pattern CH1. The dummy channel pattern DSP may be spaced apart from the lower source/drain patterns SD1. The dummy channel pattern DSP may be spaced apart from the upper source/drain patterns SD2. For example, the dummy channel pattern DSP may not be connected to any source/drain pattern. The dummy channel pattern DSP may include a semiconductor material such as silicon (Si), germanium (Ge), or silicon-germanium (SiGe), or a silicon-based dielectric material such as silicon oxide or silicon nitride. In an embodiment, the dummy channel pattern DSP may include a silicon-based dielectric material.

The upper source/drain patterns SD2 may be provided on a top surface of the first interlayer dielectric layer 110. Each of the upper source/drain patterns SD2 may be an epitaxial pattern formed by a selective epitaxial growth (SEG) process. For example, the upper source/drain pattern SD2 may have a top surface at a level higher than a top surface of the sixth semiconductor pattern SP6 of the upper channel pattern CH2.

The upper source/drain patterns SD2 may be doped with impurities to have a second conductivity type. The second conductivity type may be different from the first conductivity type of the lower source/drain patterns SD1. The second conductivity type may be a p-type. The upper source/drain patterns SD2 may include one or more of silicon (Si) and silicon-germanium (SiGe). The p-type dopants may include one or more of boron (B), gallium (Ga), etc.

The second interlayer dielectric layer 120 may be formed on the upper source/drain patterns SD2. The second interlayer dielectric layer 120 may have a top surface coplanar with those of first and second active contacts AC1 and AC2 which will be discussed below.

A plurality of gate electrodes GE1 and GE2 may be provided on the logic cell LC. For example, a first gate electrode GE1 may be provided on the lower channel pattern CH1. A second gate electrode GE2 may be provided on the upper channel pattern CH2. Referring back to FIG. 4D, the first gate electrode GE1 may have an L shape that extends in the first direction D1 and the third direction D3. When viewed in plan, the second gate electrode GE2 may have a bar shape that extends in the first direction D1. The first and second gate electrodes GE1 and GE2 may vertically overlap the stacked lower and upper channel patterns CH1 and CH2.

The first gate electrode GE1 may extend in a vertical direction (e.g., the third direction D3) to a gate capping pattern GP from a top surface of the dielectric layer ILD1 (e.g., from the top surface of the device isolation layer ST or the top surface of the active pattern AP). The first gate electrode GE1 may extend in the third direction D3 from the lower channel pattern CH1 of the first active region AR1 to the dummy channel pattern DSP and an etch stop layer ESL. The first gate electrode GE1 may extend in the third direction D3 from the first semiconductor pattern SP1 at the bottom to the third semiconductor pattern SP3. The first gate electrode GE1 may be provided on a top surface, a bottom surface, and opposite sidewalls of the lower channel pattern CH1 at least in a view of the first direction D1 as shown in FIG. 4D.

The second gate electrode GE2 may extend in a vertical direction (or the third direction D3) to the gate capping pattern GP from a top surface of the etch stop layer ESL. The second gate electrode GE2 may extend in the third direction D3 to the gate capping pattern GP from the upper channel pattern CH2 of the second active region AR2. The second gate electrode GE2 may extend from the fourth semiconductor pattern SP4 at a lower position to the sixth semiconductor pattern SP6. The second gate electrode GE2 may be provided on a top surface, a bottom surface, and opposite sidewalls of the upper channel pattern CH2 at least in the view of the first direction D1 as shown in FIG. 4D.

The first and second gate electrodes GE1 and GE2 may be provided on a top surface, a bottom surface, and opposite sidewalls of each of the first to sixth semiconductor patterns SP1 to SP6 at least in the view of the first direction D1 as shown in FIG. 4D. In this sense, a transistor forming the semiconductor device shown in FIGS. 2 to 4A-4E may be a three-dimensional field effect transistor (e.g., MBCFET or GAAFET) in which the first and second gate electrodes GE1 and GE2 three-dimensionally surrounds the respective channel patterns CH1 and CH2.

The first gate electrode GE1 may be provided in the first active region AR1 or a bottom tier of a front-end-of-line (FEOL) layer, and the second gate electrode GE2 may be provided un the second active region AR2 or a top tier of the FEOL layer. The first gate electrode GE1 and the second gate electrode GE2 may vertically overlap each other. At least one dummy channel pattern DSP, an etch stop layer ESL, and a sidewall layer SWL may be interposed between the first gate electrode GE1 and the second gate electrode GE2. Therefore, the first and second gate electrodes GE1 and GE2 may not be connected to each other, for example.

The first gate electrode GE1 may include a first portion PO1 interposed between the dielectric layer ILD1 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 interposed between the third semiconductor pattern SP3 and the dummy channel pattern DSP.

The second gate electrode GE2 may include a fifth portion PO5 interposed between the dummy channel pattern DSP and the fourth semiconductor pattern SP4, a sixth portion PO6 interposed between the fourth semiconductor pattern SP4 and the fifth semiconductor pattern SP5, a seventh portion PO7 interposed between the fifth semiconductor pattern SP5 and the sixth semiconductor pattern SP6, and an eighth portion PO8 on the seventh semiconductor pattern SP7.

Figure 4B:
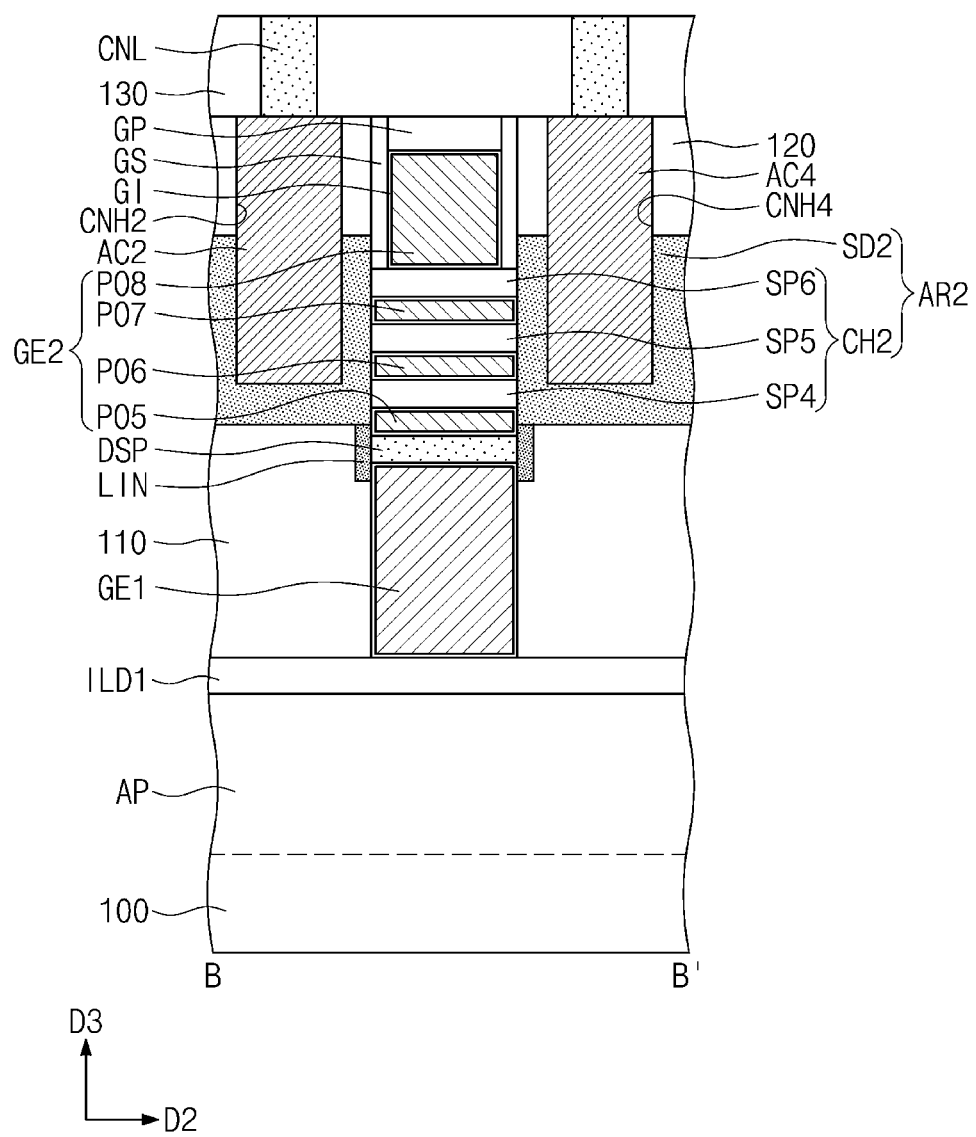

A pair of gate spacers GS may be disposed on opposite sidewalls of each of the second gate electrodes GE2 as shown in FIG. 4B. The pair of gate spacers GS may be disposed on opposite sidewalls of the eighth portion PO8. The gate spacers GS may extend in the first direction D1 along the second gate electrode GE2. The gate spacers GS may have their top surfaces at a level higher than a top surface of the second gate electrode GE2. The top surfaces of the gate spacers GS may be coplanar with that of the second interlayer dielectric layer 120. The gate spacers GS may include at least one of silicon carobonitride (SiCN), silicon carbon oxynitride (SiCON), and silicon nitride (SiN). Alternatively, the gate spacers GS may each include a multiple layer formed of at least two of SiCN, SiCON, and SiN. A pair of liner layers LIN may be provided on opposite sidewalls of each of the third portion PO3 of the first gate electrode GE1 and the fourth portion PO4 of the second gate electrode GE2.

A capping pattern GP may be provided on a top surface of each of the first and second gate electrodes GE1 and GE2. The gate capping pattern GP may extend in the first direction D1. For example, the gate capping pattern GP may include at least one of silicon oxynitride (SiON), SiCN, SiCON, and SiN.

Gate dielectric layers GI may be interposed between the first and second gate electrodes GE1 and GE2 and the first to sixth semiconductor patterns SP1 to SP6. The gate dielectric layer GI may include one or more of a silicon oxide layer, a silicon oxynitride layer, and a high-k dielectric layer. In an embodiment, the gate dielectric layer GI may include a silicon oxide layer on a surface of a corresponding one of the semiconductor patterns SP1 to SP6 and a high-k dielectric layer on the silicon oxide layer. For example, the gate dielectric layer GI may include a multiple layer of a silicon oxide layer and a high-k dielectric layer.

The high-k dielectric layer may include a high-k dielectric material whose dielectric constant is greater than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The first gate electrode GE1 may include a first work-function metal pattern on the first, second, and third semiconductor patterns SP1, SP2, and SP3. The second gate electrode GE2 may include a second work-function metal pattern on the fourth, fifth, and sixth semiconductor patterns SP4, SP5, and SP6. Each of the first and second work-function metal patterns may include nitrogen (N) and at least one of titanium (Ti), tantalum (Ta), and their compound. The first and second work-function metal patterns may have their work functions different from each other. The first and second gate electrodes GEL and GE2 may include a low-resistance metal (e.g., at least one of copper (Cu), tungsten (W), ruthenium (Ru), aluminum (Al), and molybdenum (Mo)) on the first and second work-function metal patterns.

Referring back to FIG. 3, the logic cell LC may be provided thereon with a first cell boundary CB1 that extends in the second direction D2. On a location opposite to that of the first cell boundary CB1, a second cell boundary CB2 may be defined to extend in the second direction D2. Gate cutting patterns CT may be disposed on the first and second cell boundaries CB1 and CB2.

The gate cutting pattern CT may penetrate the first and second gate electrodes GE1 and GE2. The gate cutting pattern CT may cause the first and second gate electrodes GE1 and GE2 to be separated from their neighboring gate electrodes in the first direction D1. As shown in FIG. 4D, a pair of gate cutting patterns CT may be provided on opposite ends of the first and second gate electrodes GEL and GE2. The gate cutting patterns CT may include a dielectric material, such as silicon oxide, silicon nitride or a combination thereof.

A gate contact GC may be provided to penetrate a third interlayer dielectric layer 130 and the gate capping pattern GP to come into electrical connection with the first gate electrode GE1 or the second gate electrode GE2. The gate contact GC may include metal selected from copper (Cu), aluminum (Al), ruthenium (Ru), cobalt (Co), tungsten (W), and molybdenum (Mo).

Active contacts AC1 to AC4 may be provided to electrically connect to the lower and upper source/drain patterns SD1 and SD2. As illustrated in FIG. 3, a first active contact AC1 and a second active contact AC2 may be provided which are adjacent to sides of the first and second gate electrodes GE1 and GE2. A third active contact AC3 and a fourth active contact AC4 may be provided which are adjacent to other sides of the first and second gate electrodes GE1 and GE2. For example, the first to fourth active contacts AC1 to AC4 may include one or more of metal and/or doped semiconductor. The metal may include at least one selected from copper (Cu), aluminum (Al), ruthenium (Ru), cobalt (Co), tungsten (W), and molybdenum (Mo).

Referring again to FIG. 4A, the first and third active contacts AC1 and AC3 may extend from the top surface of the second interlayer dielectric layer 120 through the first and second interlayer dielectric layers 110 and 120 to the lower source/drain patterns SD1. In an embodiment, the first and third active contacts AC1 and AC3 may have their bottom surfaces located at the same level. For example, the first and third active contacts AC1 and AC3 may be formed to have substantially the same depth.

Referring again to FIG. 4B, the second and fourth active contacts AC2 and AC4 may extend from the top surface of the second interlayer dielectric layer 120 through the second interlayer dielectric layer 120 to the upper source/drain patterns SD2. In an embodiment, the second and fourth active contacts AC2 and AC4 may have their bottom surfaces located at the same level. For example, the second and fourth active contacts AC2 and AC4 may be formed to have substantially the same depth.

Figure 4C:
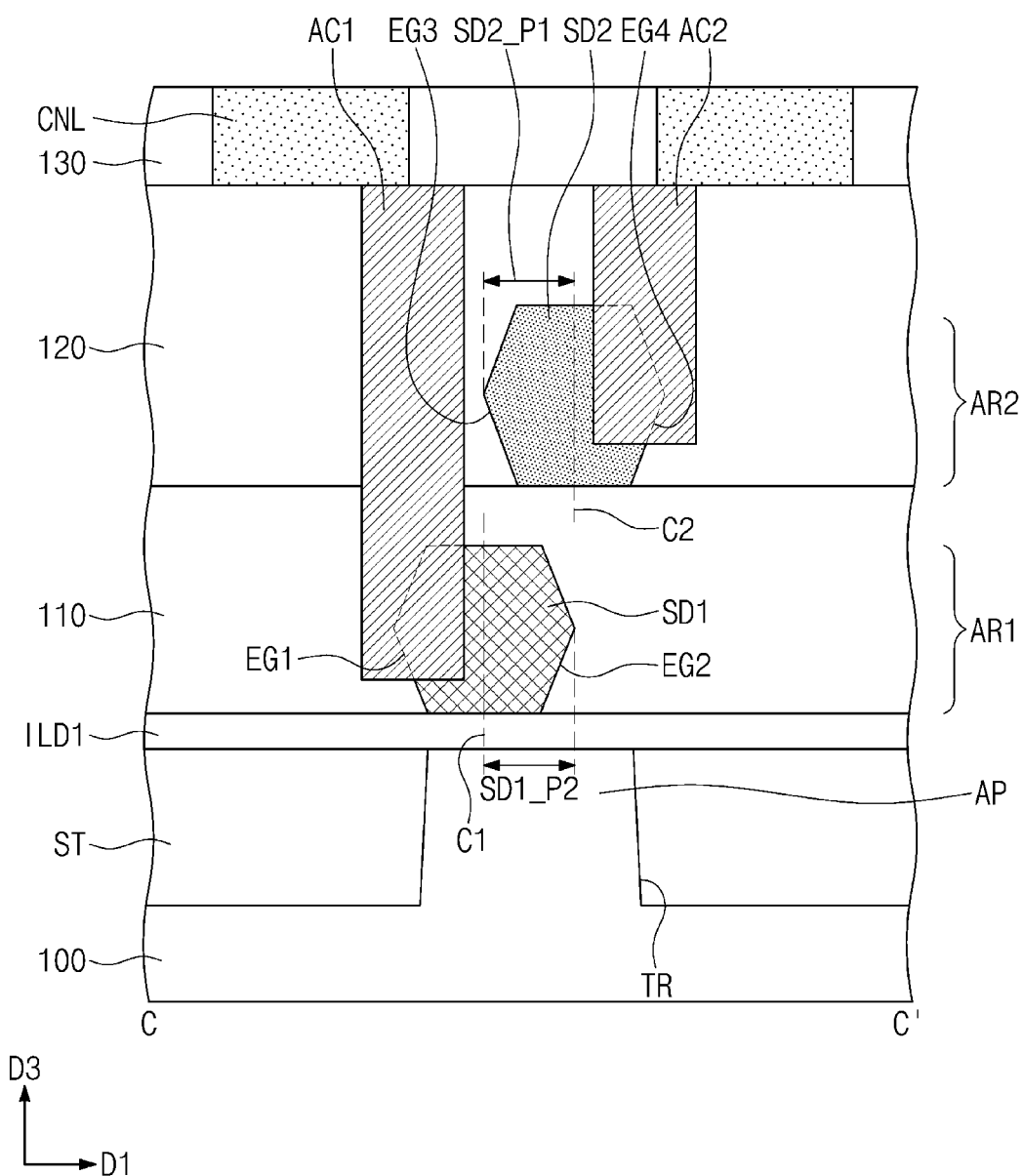
Figure 4D:
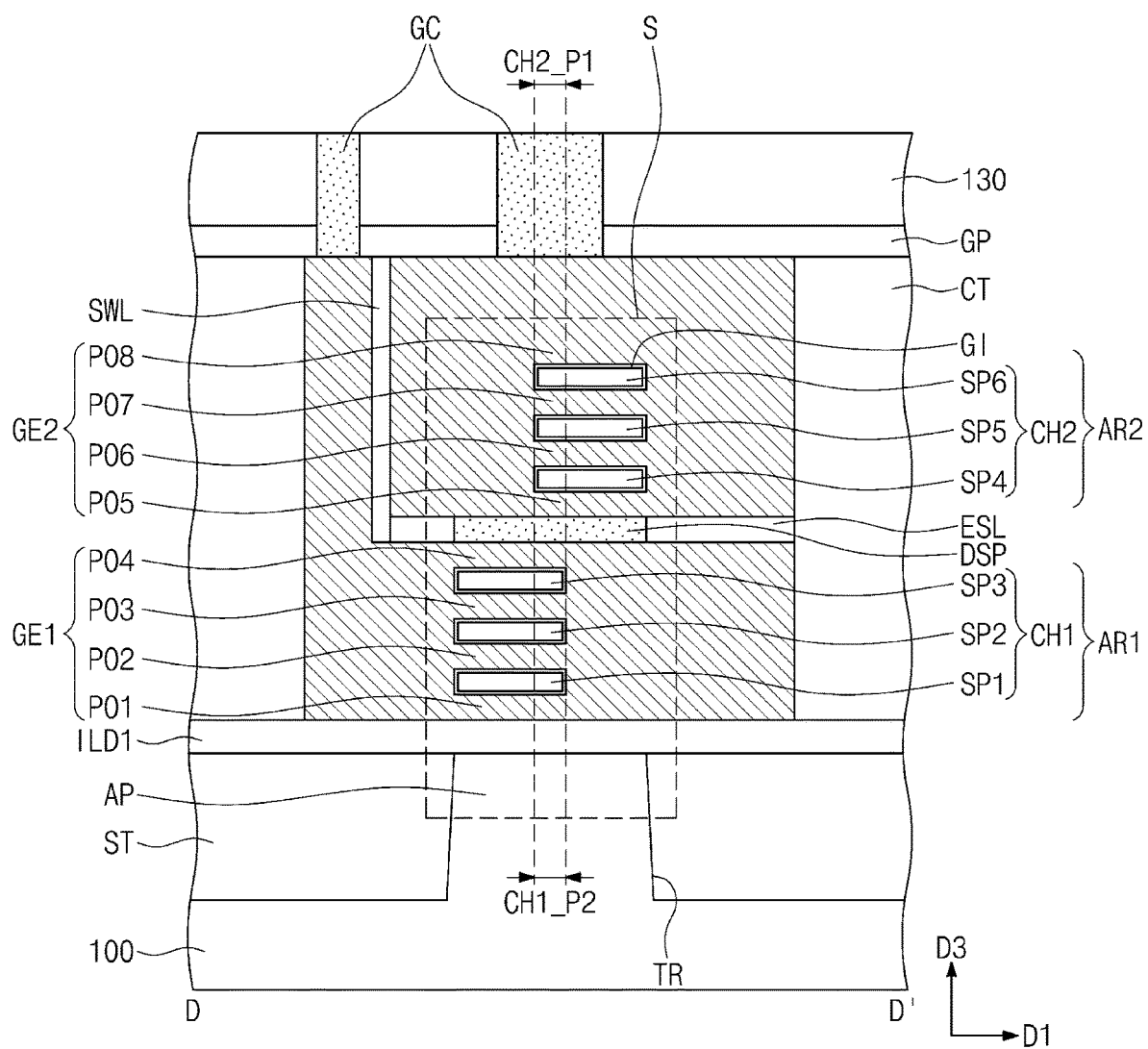
Figure 4E:
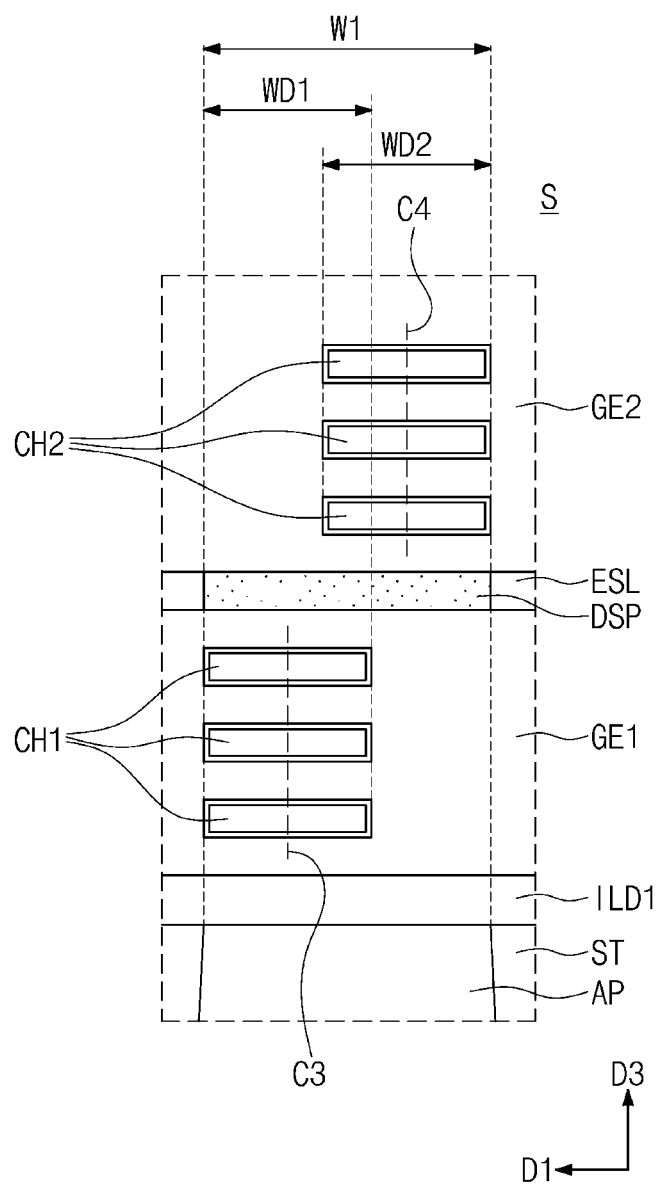
FIG. 4E illustrates an enlarged view showing section S depicted in FIG. 4D.

Referring to FIGS. 3 and 4C, the first active contact AC1 and the second active contact AC2 may be provided between neighboring gate electrodes. The lower source/drain pattern SD1 and the upper source/drain pattern SD2 may be stacked between the neighboring gate electrodes. The first active contact AC1 and the second active contact AC2 may be disposed adjacent to each other in the first direction D1.

For example, the first central line C1 of the lower source/drain pattern SD1 may be offset in the first direction D1 from the second central line C2 of the upper source/drain pattern SD2. The first active contact AC1 may be positioned opposite to the second central line C2 with respect to the first central line C1. Therefore, the first active contact AC1 may not be in contact with, but may be spaced apart from the third edge portion EG3 of the upper source/drain pattern SD2. For example, the first active contact AC1 may not be connected to the upper source/drain pattern SD2, but may be connected only to the lower source/drain pattern SD1 among the lower and upper source/drain patterns SD1 and SD2.

The second active contact AC2 may be positioned opposite to the first active contact AC1 with respect to the second central line C2. Because the second active contact AC2 does not extend to the first active region AR1, the second active contact AC2 may not be connected to the lower source/drain pattern SD1. In this configuration, the second active contact AC2 may be connected only to the upper source/drain pattern SD2 among the lower and upper source/drain patterns SD1 and SD2. Therefore, the first active contact AC1 may be electrically connected to the lower source/drain pattern SD1 but not to the upper source/drain pattern SD2. The second active contact AC2 may be electrically connected only to the upper source/drain pattern SD2, but not to the lower source/drain pattern SD1.

Referring to FIG. 4C again, the bottom surface of the first active contact AC1 may be located at a level lower than the bottom surface of the second active contact AC2. For example, the bottom surface of the first active contact AC1 may be located at a level between those of top and bottom surfaces of the lower source/drain pattern SD1. The first active contact AC1 may be directly connected to the first edge portion EG1 of the lower source/drain pattern SD1. Alternatively or additionally, the first active contact AC1 may be directly connected to a top portion of the lower source/drain pattern SD1. The bottom surface of the second active contact AC2 may be located at a level between those of top and bottom surfaces of the upper source/drain pattern SD2. The second active contact AC2 may be directly connected to the fourth edge portion EG4 of the upper source/drain pattern SD2. Alternatively or additionally, the second active contact AC2 may be directly connected to a top portion of the upper source/drain pattern SD2. The first and second active contacts AC1 and AC2 may each have a pillar shape that vertically extends in the third direction D3.

According to some embodiments, the first to fourth active contacts AC1 to AC4 may be correspondingly coupled to four terminals of stacked NMOS and PMOS. For example, the first active contact AC1 may be coupled to a source terminal of a lower NMOS, the second active contact AC2 may be coupled to a source terminal of an upper PMOS, the third active contact AC3 may be coupled to a drain terminal of the lower NMOS, and the fourth active contact AC4 may be coupled to a drain terminal of the upper PMOS.

Figure 5:
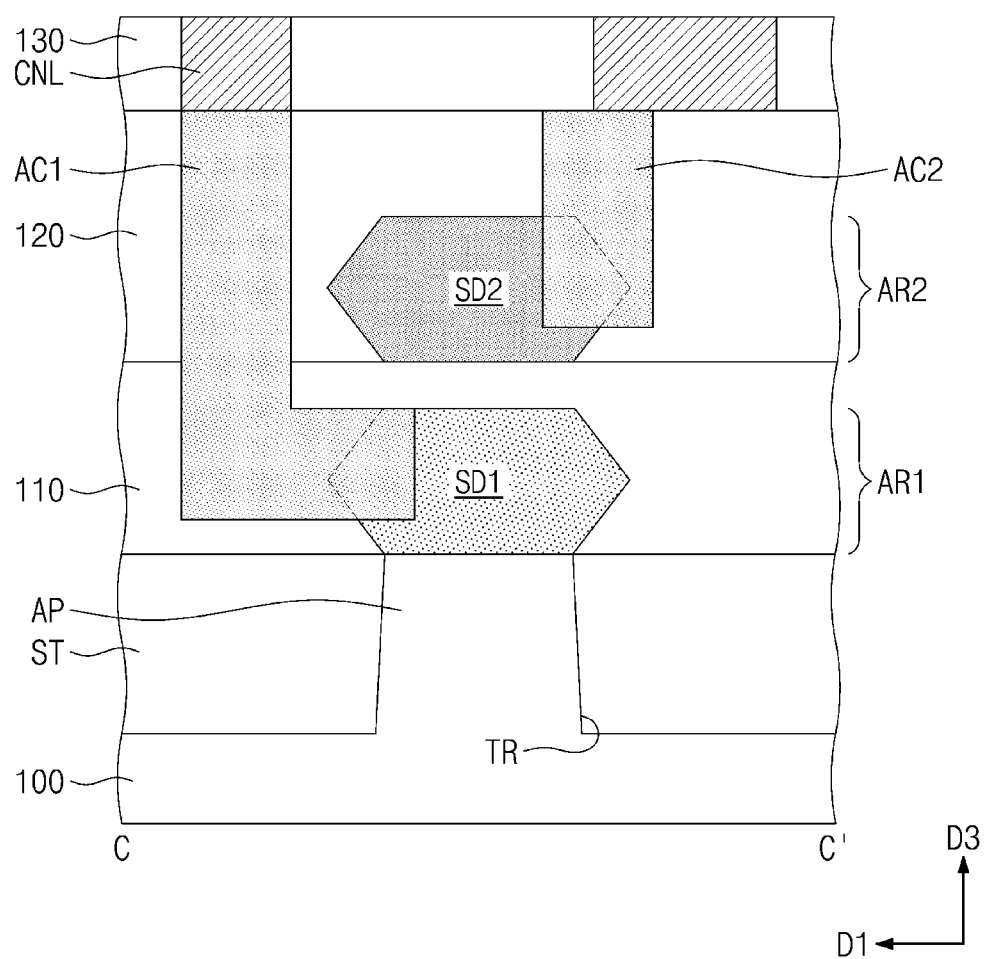
FIG. 5 illustrates a cross-sectional view taken along line C-C' of FIG. 3, showing a three-dimensional semiconductor device according to an embodiment.

FIG. 5 illustrates a cross-sectional view taken along line C-C' of FIG. 3, showing a three-dimensional semiconductor device according to an embodiment. Referring to FIG. 5, the first active contact AC1 may be formed to have an L shape so as to be coupled to the lower source/drain pattern SD1 without being in contact with the upper source/drain pattern SD2. The second active contact AC2 may be formed to have a small depth so as to be coupled to the upper source/drain pattern SD2 without being in contact with the lower source/drain pattern SD1.

According to the present embodiment, it is required that the first and second active contacts AC1 and AC2 be formed to be asymmetric with each other so as to be coupled the stacked lower and upper source/drain patterns SD1 and SD2, respectively. In the present embodiment, the first active contact AC1 is formed to have an L shape, which may increase a process difficulty and a reduction in device reliability.

According to an embodiment, an active contact may have a pillar shape that vertically extends. To connect the active contact to a lower source/drain pattern, the lower source/drain pattern may be formed to have a width greater than that of an upper source/drain pattern in the first direction D1. In this case, a gate may have a wide gate pitch, and the upper source/drain pattern may have difficulty in adjusting a size thereof. This may produce problems such as increase in a process difficulty and reduction in electrical properties.

In contrast, according to the embodiments described in reference to FIGS. 3 to 4A-4E, the first to fourth active contacts AC1 to AC4 may each have a pillar shape that extends straight down from above in the same third direction D3. The first to fourth active contacts AC1 to AC4 may be formed to have the same diameter or width. In these embodiments, the central lines C1 and C2 of the lower and upper source/drain patterns SD1 and SD2 may be offset from each other, and the lower and upper source/drain patterns SD1 and SD2 may have an equal width, with the result that the first to fourth active contacts AC1 to AC4 may be one-to-one connected to four lower and upper source/drain patterns SD1 and SD2. Thus, the semiconductor device according to these embodiments may achieve a reduced process difficulty, and improved device density and device reliability.

A third interlayer dielectric layer 130 may be provided on the second interlayer dielectric layer 120. In an embodiment, connection lines CNL may be provided in the third interlayer dielectric layer 130. The connection lines CNL may be provided on the first to fourth active contacts AC1 to AC4. The connection lines may be an FEOL structure such as metal lines connected to a voltage source or provided for signal routing.

FIGS. 6A to 11 illustrate cross-sectional views showing a method of manufacturing a three-dimensional semiconductor device stack pattern on an active pattern according to some embodiments. FIGS. 6A, 7A, 8A, 9A, and 10A are cross-sectional views each of which corresponds to that taken along line A-A' of FIG. 3. FIGS. 6B, 7B, 8B, 9B, and 10B are cross-sectional views each of which corresponds to that taken along line B-B' of FIG. 3. FIGS. 6C, 7C, 8C, 9C, 10C, and 11 are cross-sectional views each of which corresponds to that taken along line D-D' of FIG. 3.

Figure 6A:
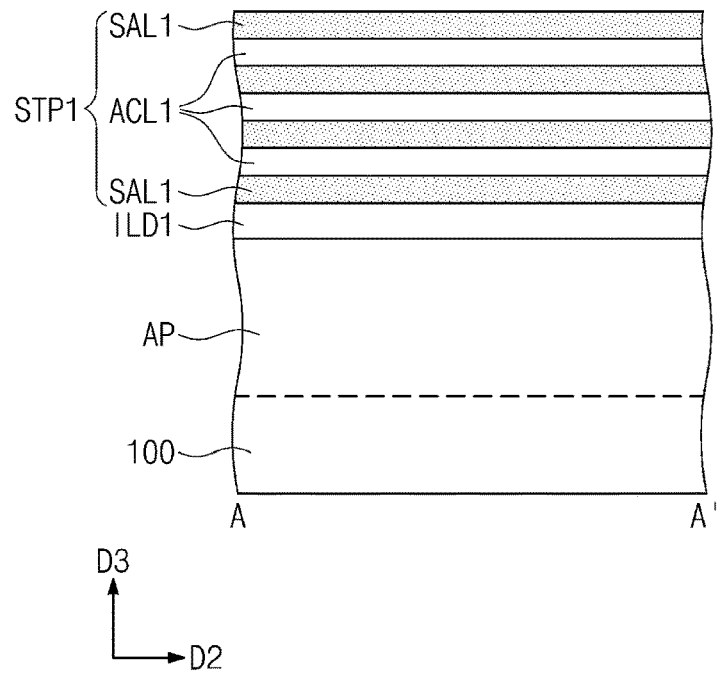
FIGS. 6A to 11 illustrate cross-sectional views showing a method of manufacturing a three-dimensional semiconductor device stack pattern on an active pattern according to some embodiments.
Figure 6B:
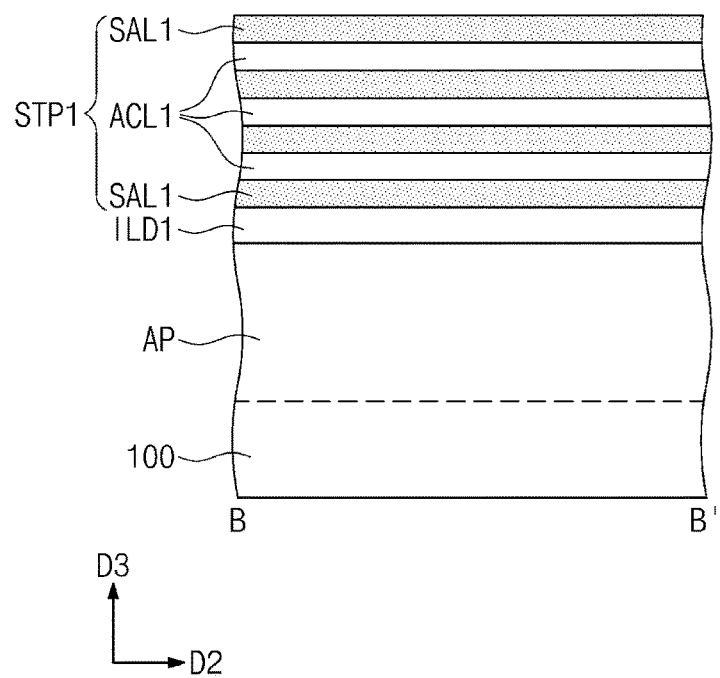
Figure 6C:
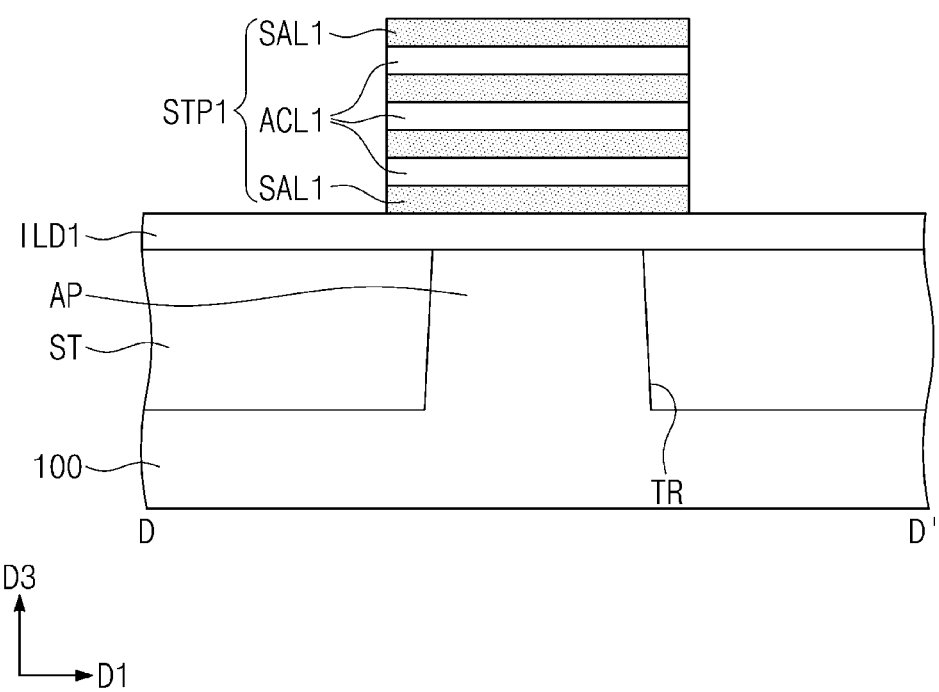

Referring to FIGS. 6A to 6C, an interlayer dielectric layer ILD1 may be provided on a substrate 100. First sacrificial layers SAL1 and first active layers ACL1 may be alternately stacked on the dielectric layer ILD1. The first sacrificial layers SAL1 may include one of silicon (Si), germanium (Ge), and silicon-germanium (SiGe), and the first active layers ACL1 may include another of silicon (Si), germanium (Ge), and silicon-germanium (SiGe). For example, the first sacrificial layers SAL1 may include silicon-germanium (SiGe), and the first active layers ACL1 may include silicon (Si). Each of the first sacrificial layers SAL1 may have a germanium concentration of about 10 at % to about 30 at %.

Figure 7A:
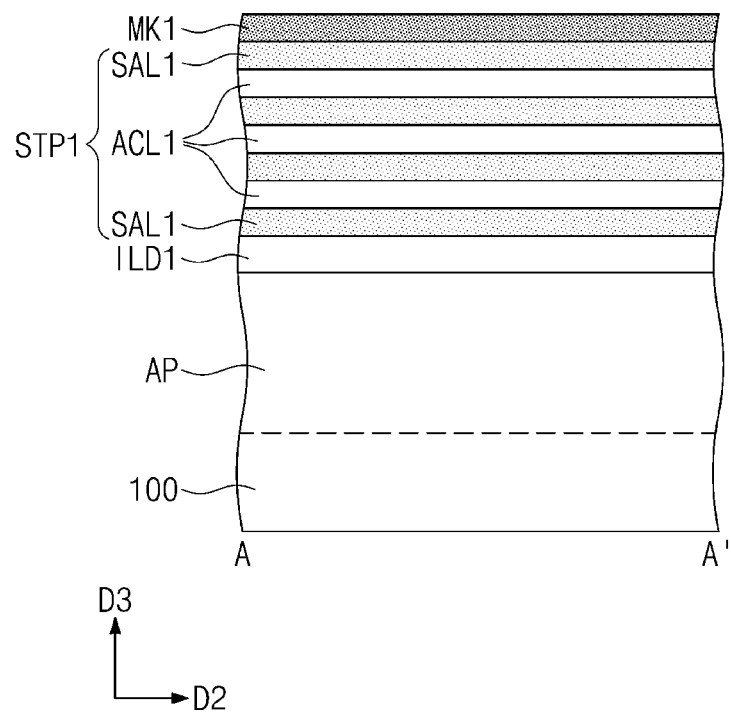
Figure 7B:
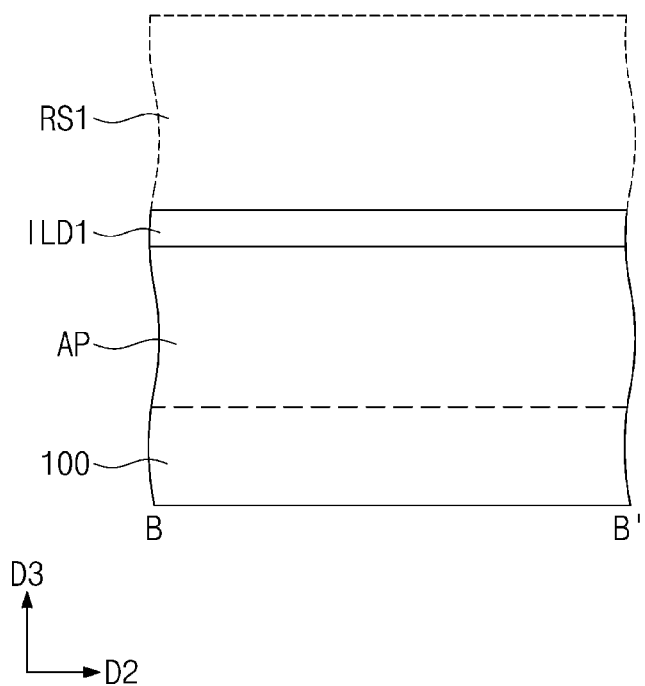
Figure 7C:
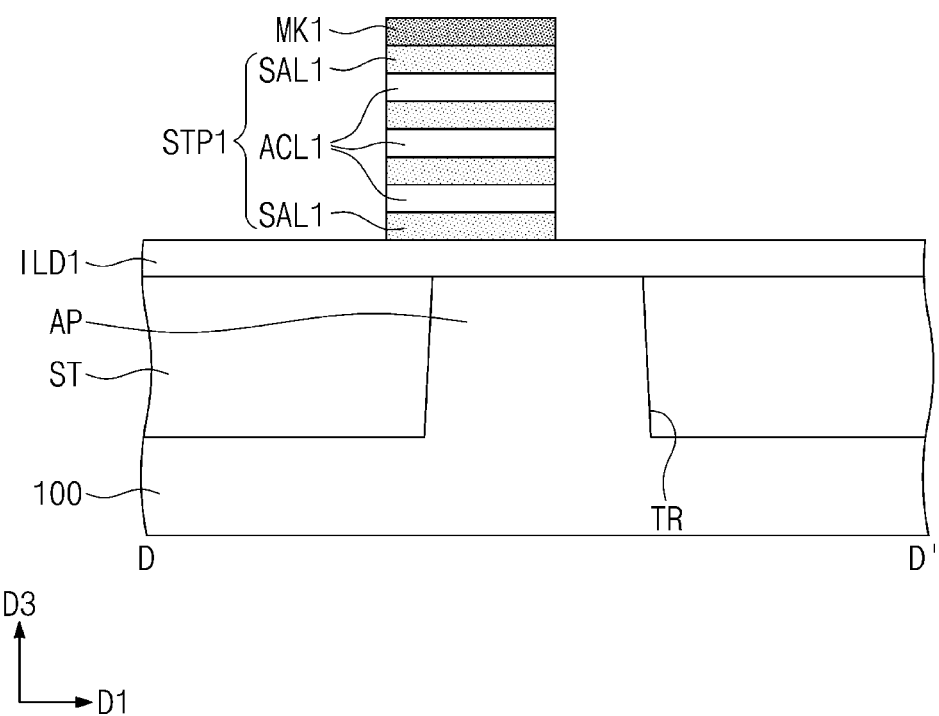

Referring to FIGS. 7A to 7C, the first sacrificial layers SAL1 and the first active layers ACL1 may be patterned to form a first stack pattern STP1. The formation of the first stack pattern STP1 may include forming a first hardmask pattern MK1 on an uppermost first sacrificial layer SAL1, and using the first hardmask pattern MK1 as an etching mask to etch the layers SAL1 and ACL1 stacked on the substrate 100. The first stack pattern STP1 may have a bar shape that extends in a first direction D1 and a second direction D2. In this step, the stacked layers SAL1 and ACL1 may be etched to form a first recess RS1. The first recess RS1 may be formed on an active pattern AP and a device isolation layer ST.

Figure 8A:
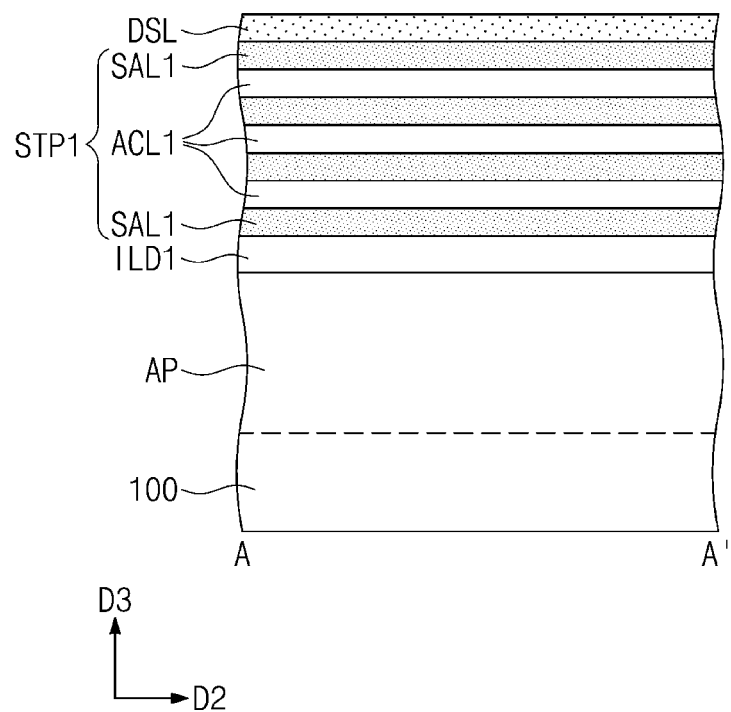
Figure 8B:
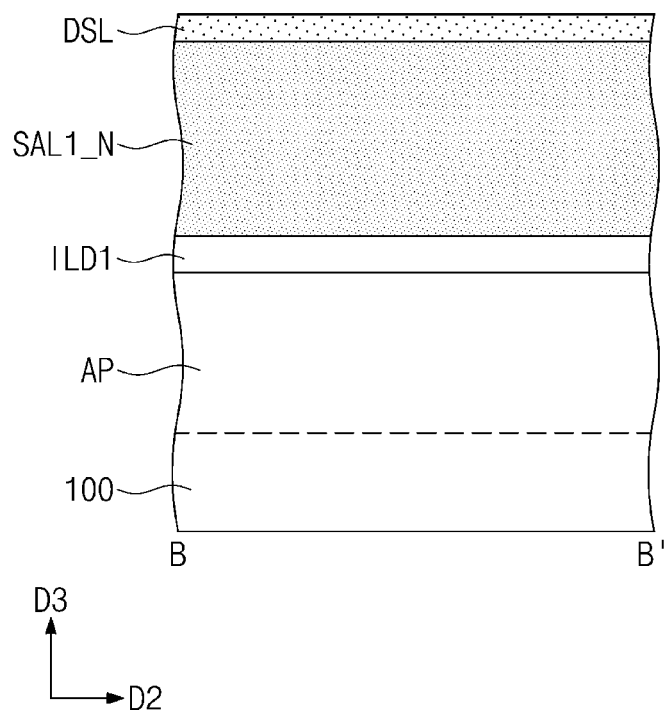
Figure 8C:
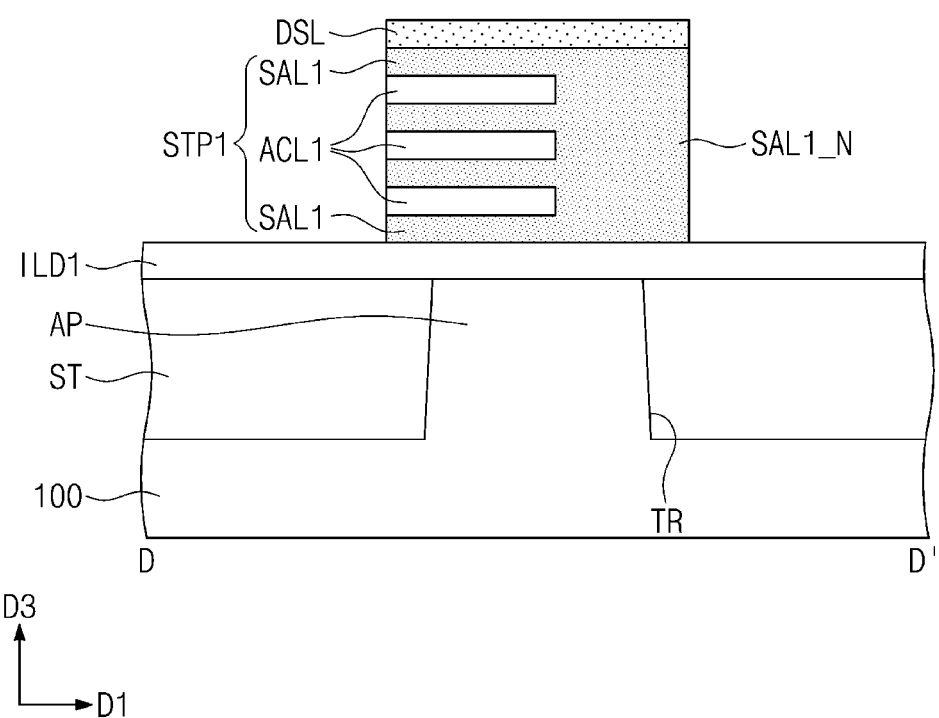

Referring to FIGS. 8A to 8C, a second sacrificial layer SAL1_N may be formed in the first recess RS1. The second sacrificial layer SAL1_N may include the same material as that of the first sacrificial layers SAL1. The first stack pattern STP1 may have a top surface coplanar with that of the second sacrificial layer SAL1_N. A separation layer DSL may be formed on the uppermost first sacrificial layer SAL1 and the second sacrificial layer SAL1_N. In an embodiment, the separation layer DSL may have a thickness substantially the same as that of the first sacrificial layer SAL1.

According to an embodiment, the separation layer DSL may have a thickness greater than that of the first active layer ACL1 and that of the first sacrificial layer SAL1. The separation layer DSL may include silicon (Si) or silicon-germanium (SiGe). When the separation layer DSL includes silicon-germanium (SiGe), the separation layer DSL may have a germanium concentration greater than that of the first sacrificial layer SAL1. For example, the separation layer DSL may have a germanium concentration of about 40 at % to about 90 at %.

Figure 9A:
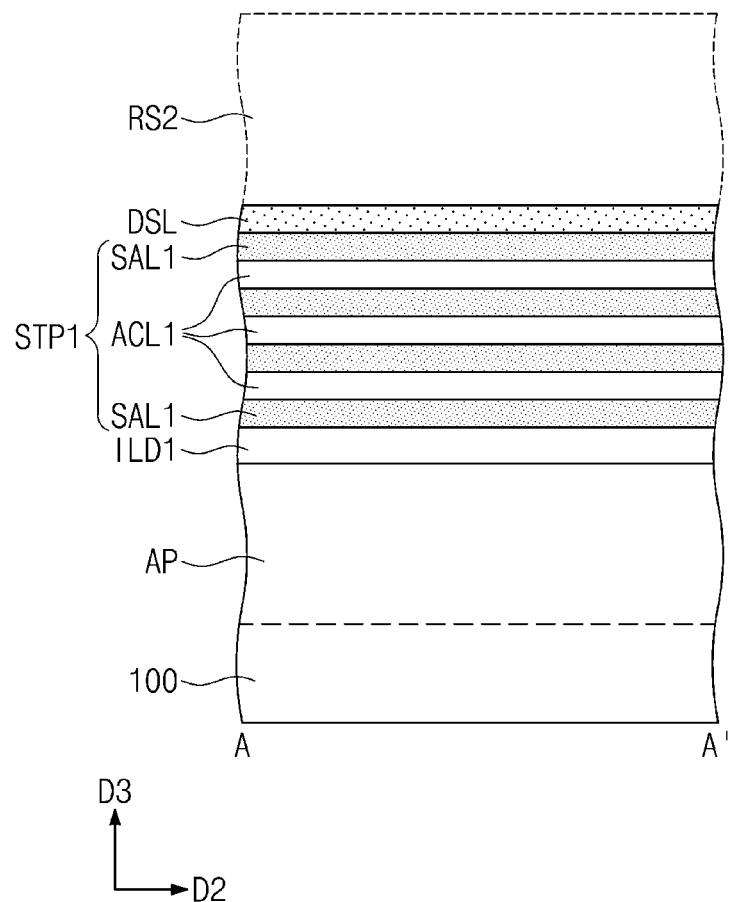
Figure 9B:
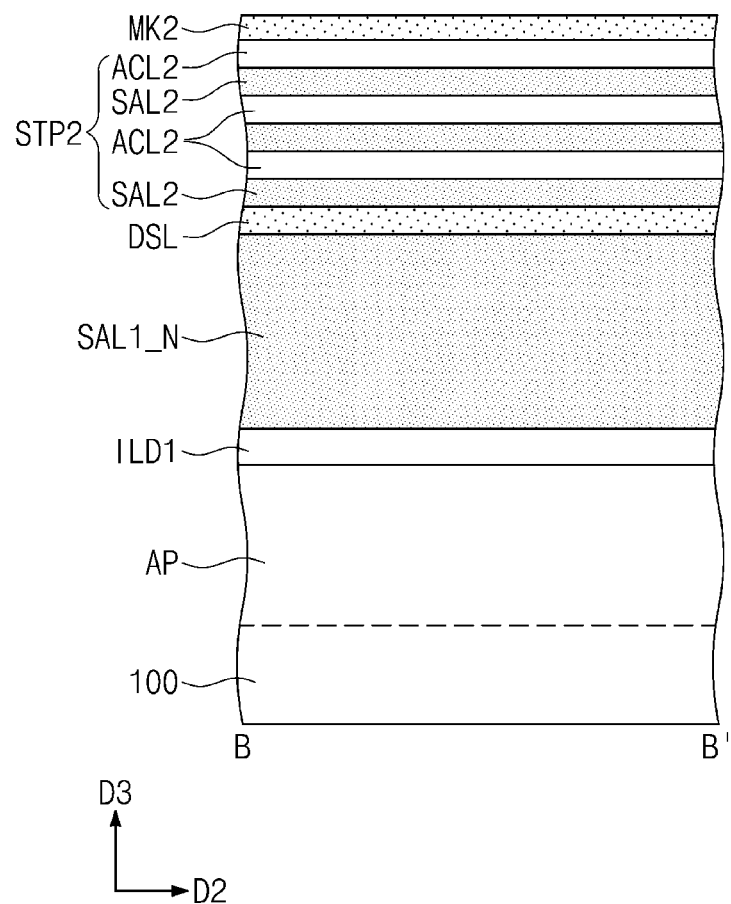
Figure 9C:
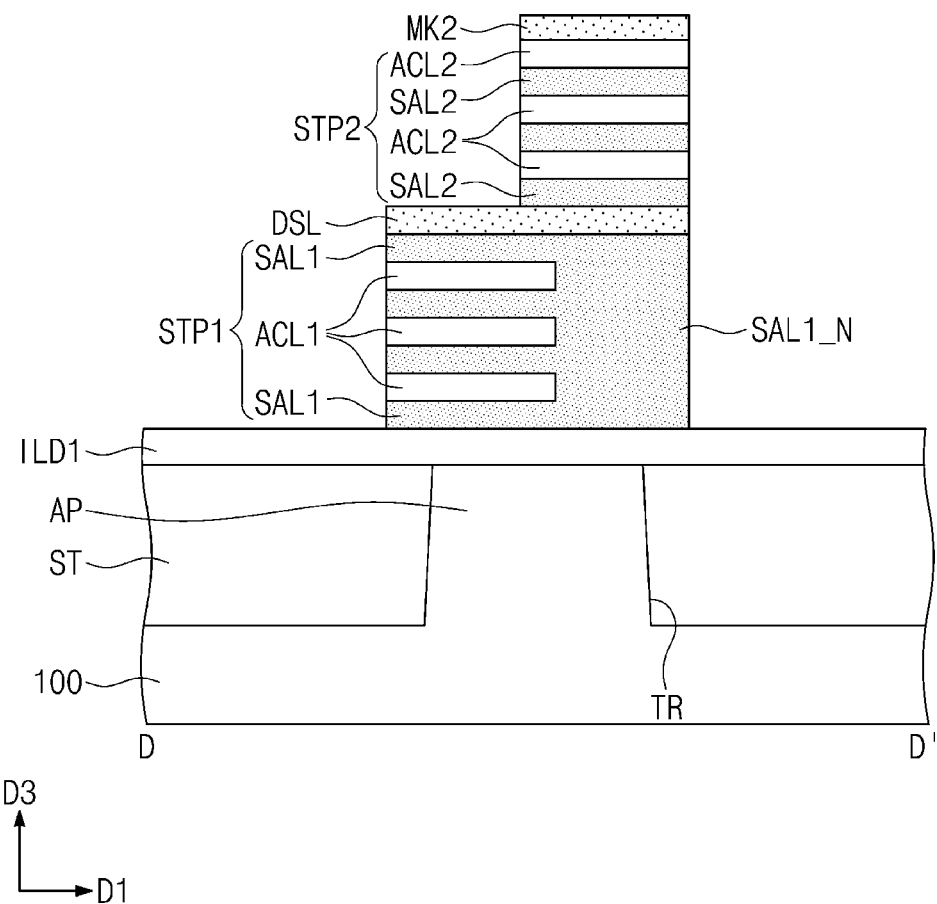

Referring to FIGS. 9A to 9C, third sacrificial layers SAL2 and second active layers ACL2 may be alternately stacked on the separation layer DSL. Each of the third sacrificial layers SAL2 may include the same material as that of the first sacrificial layer SAL1, and each of the second active layers ACL2 may include the same material as that of the first active layer ACL1. The separation layer DSL may be interposed between the first sacrificial layer SAL1 and the third sacrificial layer SAL2.

The third sacrificial layers SAL2 and the second active layers ACL2 may be patterned to form a second stack pattern STP2. The formation of the second stack pattern STP2 may include forming a second hardmask pattern MK2 on an uppermost second active layer ACL2, and using the second hardmask pattern MK2 as an etching mask to etch the layers SAL2 and ACL2 stacked on the separation layer DSL. The second stack pattern STP2 may have a bar shape that extends in the first direction D1 and the second direction D2. A first portion of the second stack pattern STP2 may vertically overlap a second portion of the first stack pattern STP1. In addition, the second stack pattern STP2 may vertically overlap the second sacrificial layer SAL1_N.

The stacked layers SAL2 and ACL2 may be etched to form a second recess RS2. The second recess RS2 may be formed on the active pattern AP and the device isolation layer ST. The second recess RS2 may be formed on the first stack pattern STP1. The second recess RS2 may not be formed on the second sacrificial layer SAL1_N.

Figure 10A:
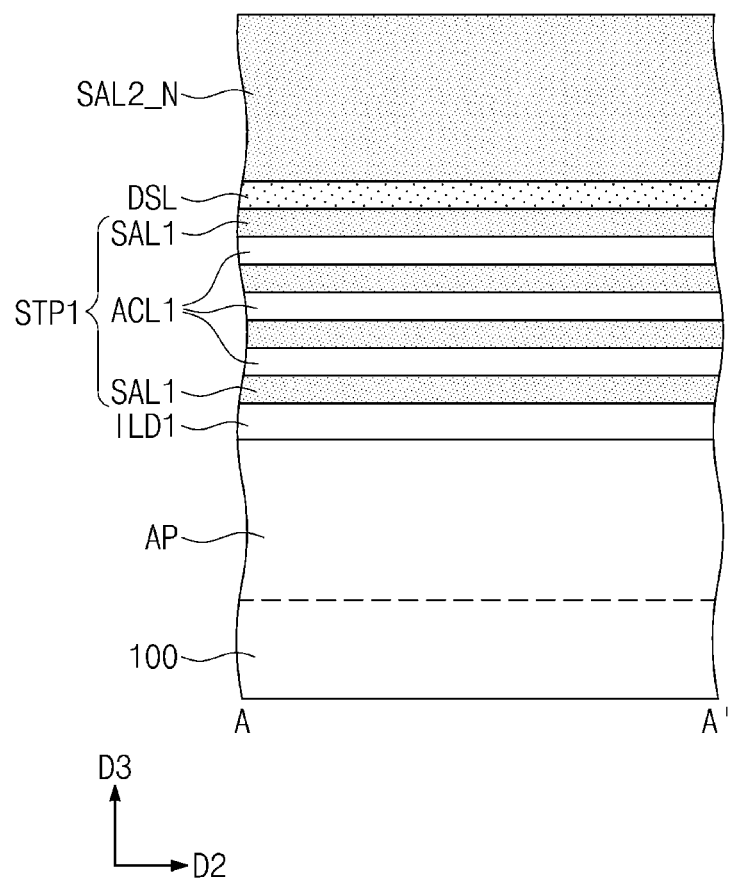
Figure 10B:
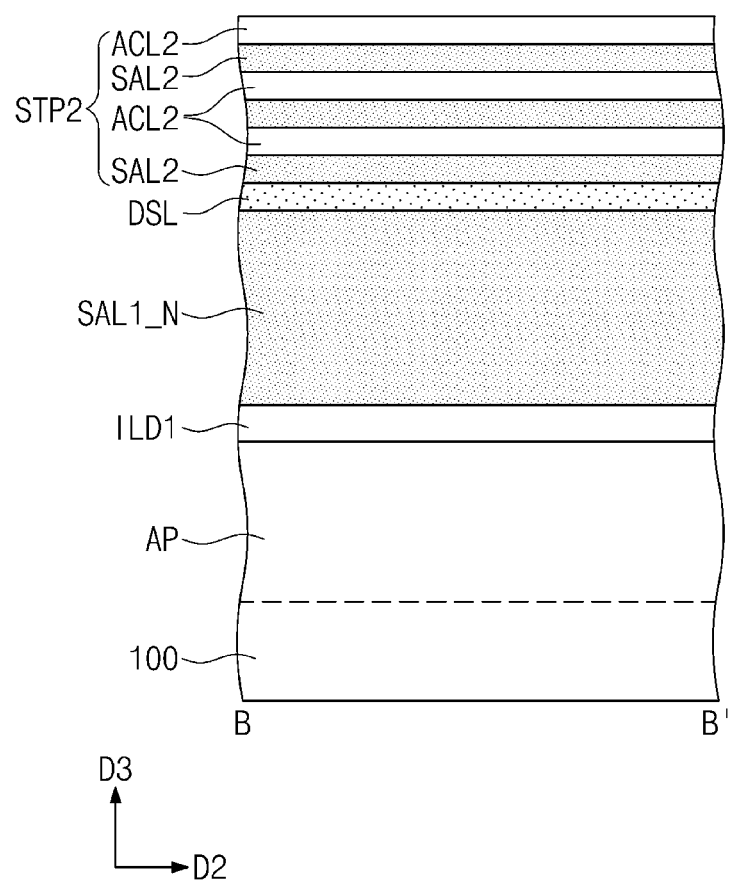
Figure 10C:
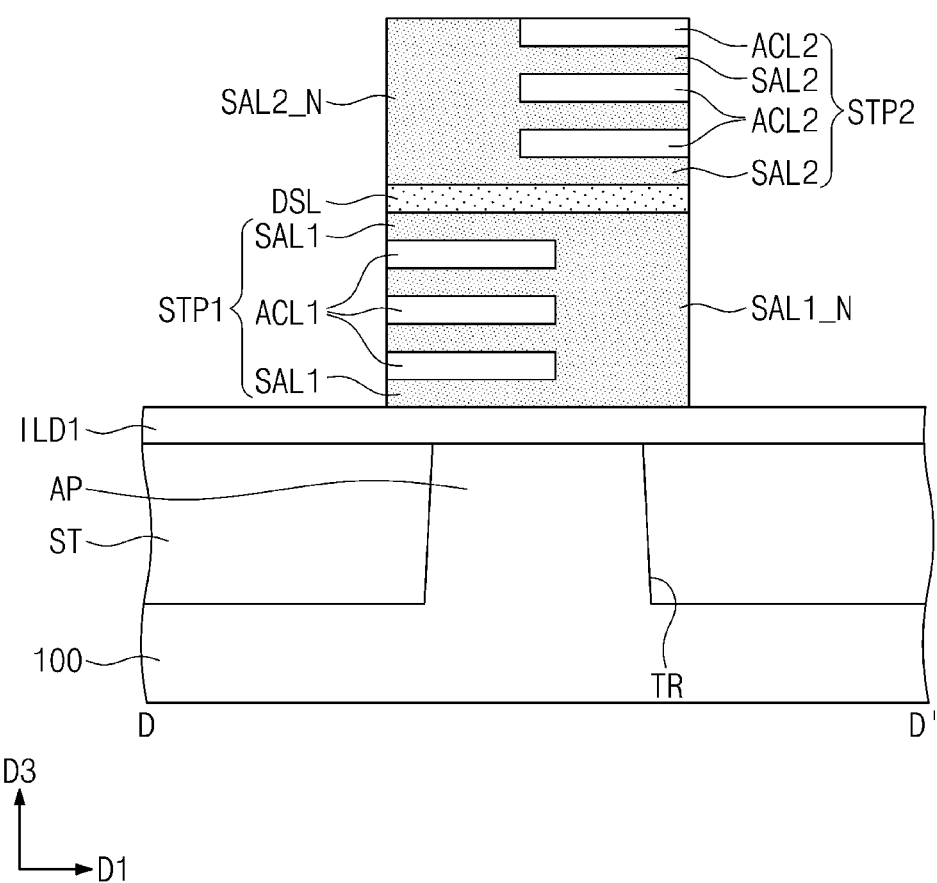

Referring to FIGS. 10A to 10C, a fourth sacrificial layer SAL2_N may be formed in the second recess RS2. The fourth sacrificial layer SAL2_N may include the same material as that of the third sacrificial layers SAL2. The second stack pattern STP2 may be coplanar with that of the fourth sacrificial layer SAL2_N.

Figure 11:
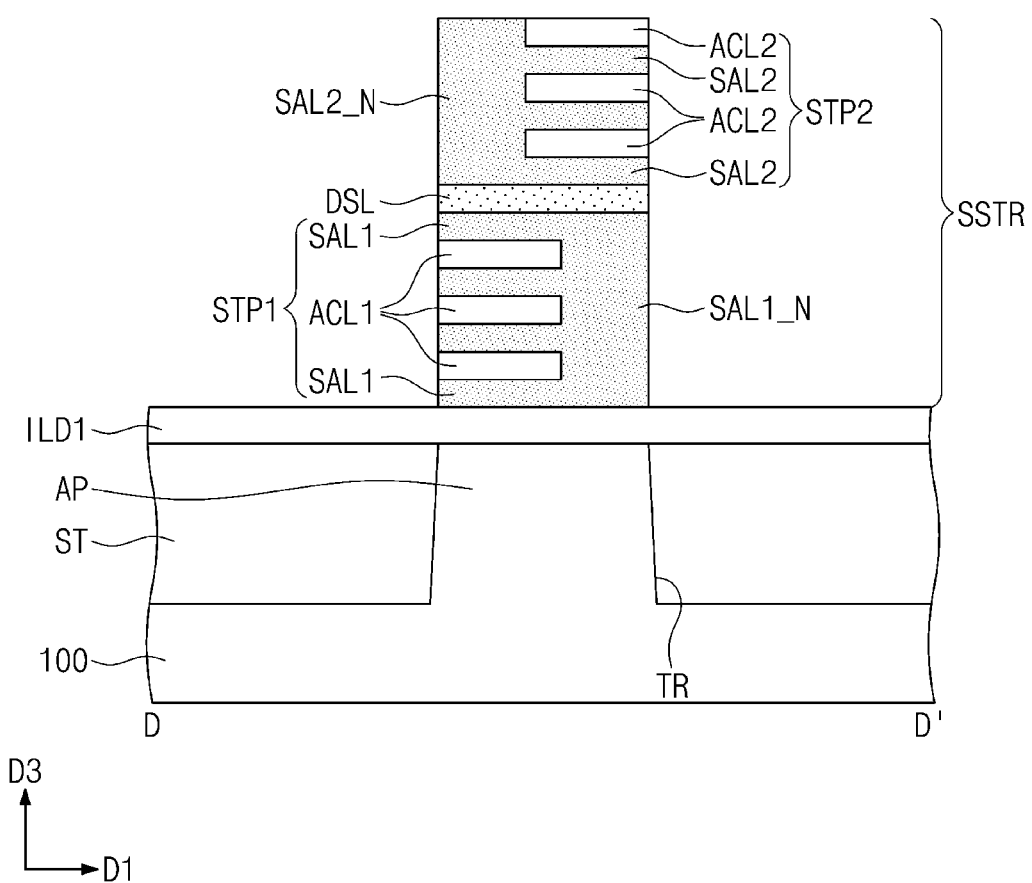

Referring to FIG. 11, a stack structure SSTR may be formed by patterning the first stack pattern STP1, the second sacrificial layer SAL1_N, the separation layer DSL, the second stack pattern STP2, and the fourth sacrificial layer SAL2_N. In this case, a width of the stack structure SSTR may be a width in a first direction D1, and a width of the active pattern AP may also be a width in the first direction D1. The stack structure SSTR may be patterned to have a width equal to that of the active pattern AP on the substrate 100, and thus the stack structure SSTR may be eventually formed.

FIGS. 12A to 21C illustrate cross-sectional views showing a method of manufacturing a three-dimensional semiconductor device according to some embodiments. FIGS. 12A, 13A, 14A, 15A, 18A, 19A, 20A, and 21A are cross-sectional views each of which corresponds to that taken along line A-A' of FIG. 3. FIGS. 12B, 13B, 14B, 15B, 18B, 19B, 20B, and 21B are cross-sectional views each of which corresponds to that taken along line B-B' of FIG. 3. FIGS. 13C, 14C, 15C, and 21C are cross-sectional views each of which corresponds to that taken along line C-C' of FIG. 3. FIGS. 12C, 16, 17, 18C, 19C, and 20C are cross-sectional views each of which corresponds to that taken along line D-D' of FIG. 3.

Figure 12A:
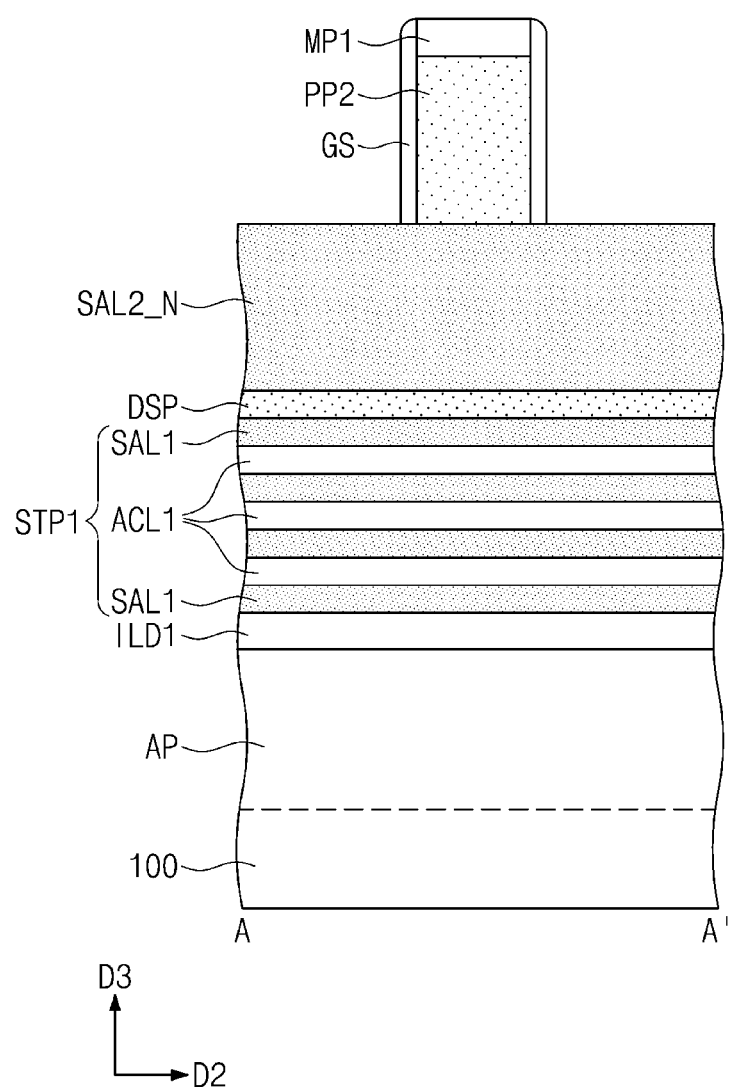
FIGS. 12A to 21C illustrate cross-sectional views showing a method of manufacturing a three-dimensional semiconductor device according to some embodiments.
Figure 12B:
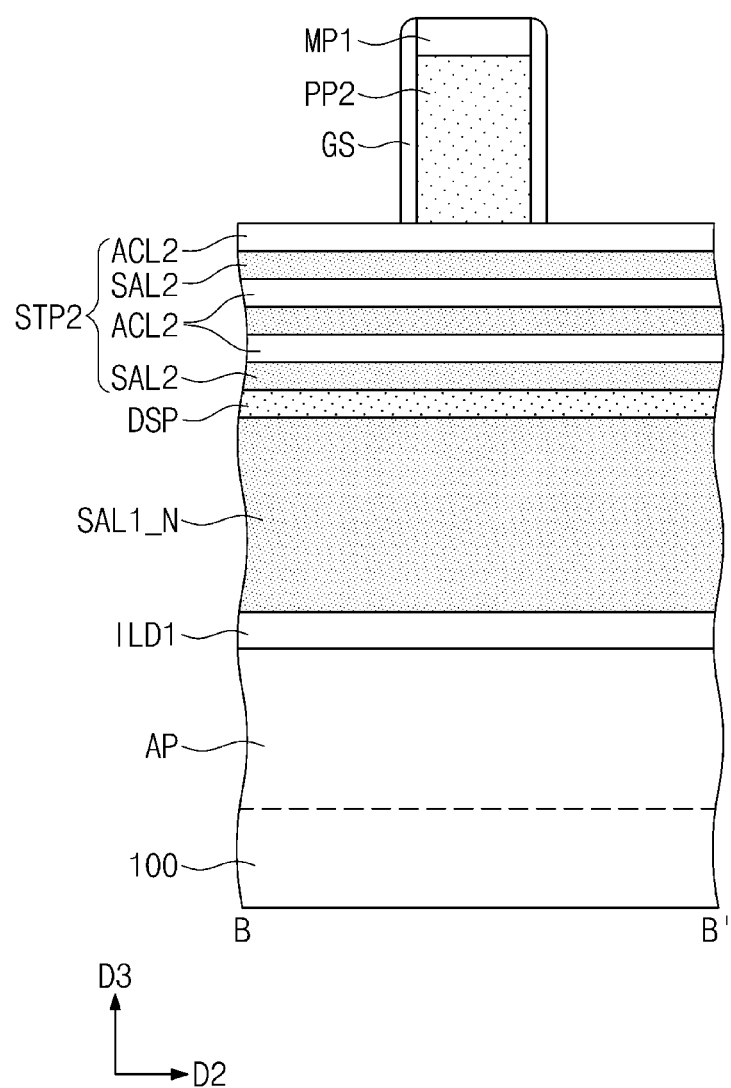
Figure 12C:
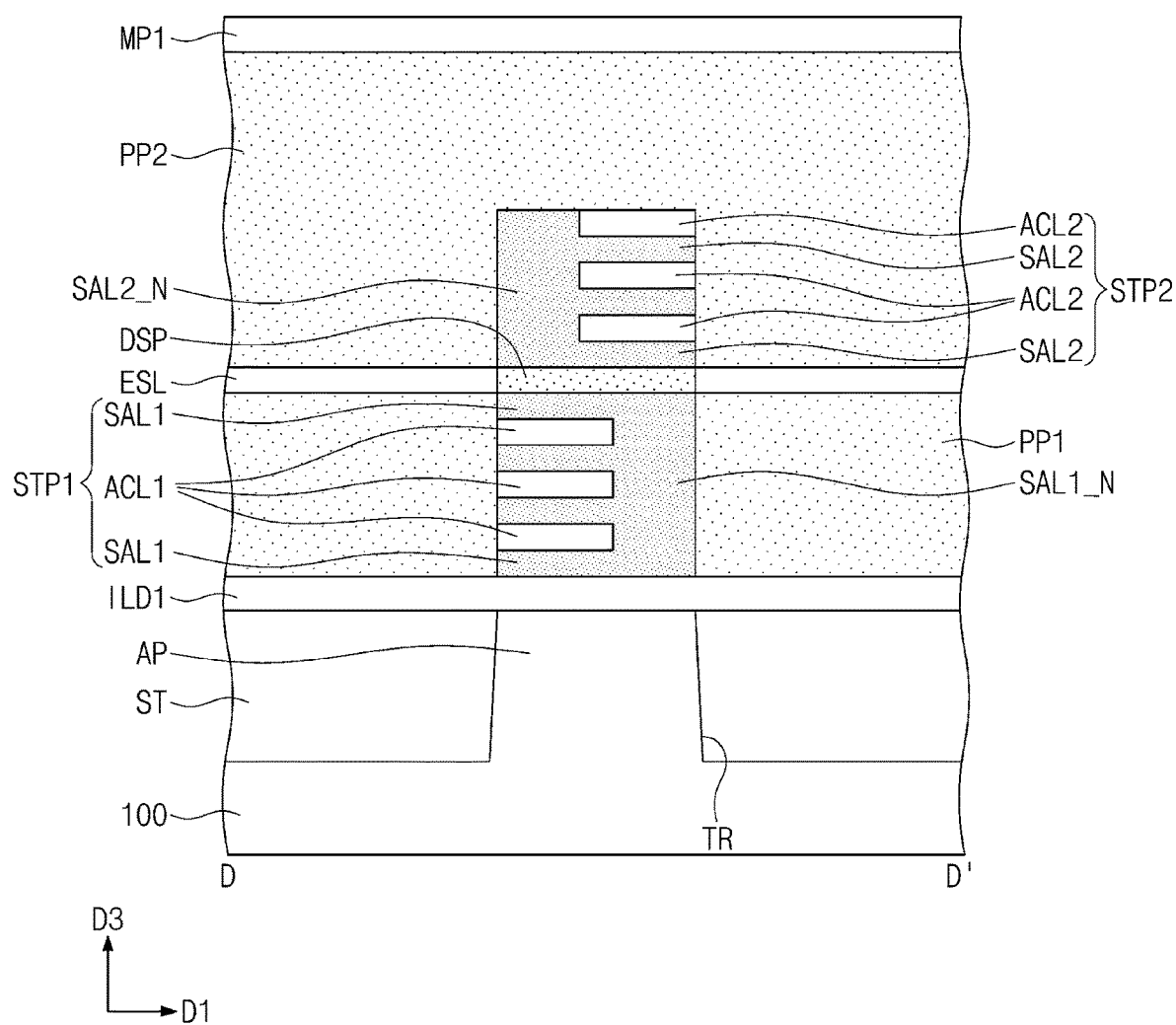

Referring to FIGS. 12A to 12C, sacrificial patterns PP1 and PP2 may be formed to run across the stack structure (see SSTR of FIG. 11). The sacrificial patterns PP1 and PP2 may be formed to have a linear shape that extends in the first direction D1. A first sacrificial pattern PP1 may be formed on the dielectric layer ILD1. An etch stop layer ESL may be formed on the first sacrificial pattern PP1. The etch stop layer ESL may be formed at the same height (or level) as that of a dummy channel pattern DSP. For example, the dummy channel pattern DSP may have a top surface coplanar with that of the etch stop layer ESL. A second sacrificial pattern PP2 may be formed on the etch stop layer ESL, the second stack pattern STP2, and the fourth sacrificial layer SAL2_N.

For example, the formation of the first and second sacrificial patterns PP1 and PP2 may include forming a first sacrificial layer on an entire surface of the substrate 100, forming the etch stop layer ESL on the first sacrificial layer, forming a second sacrificial layer on the etch stop layer, forming a first hardmask MP1 on the second sacrificial layer, and using the first hardmask MP1 as an etching mask to pattern the first sacrificial layer, the etch stop layer ESL, and the second sacrificial layer. The first and second sacrificial layers, which may also be referred to as a dummy gate structure, may include one or more of amorphous silicon and polysilicon.

A pair of gate spacers GS may be formed on opposite sidewalls of each of the first and second sacrificial patterns PP1 and PP2. For example, a spacer layer may be conformally formed on the entire surface of the substrate 100. The spacer layer may be formed on the first and second sacrificial patterns PP1 and PP2 and the first hardmask MP1. For example, the spacer layer may include one or more of SiCN, SiCON, and SiN. The spacer layer may be anisotropically etched to form gate spacers GS.

Figure 13A:
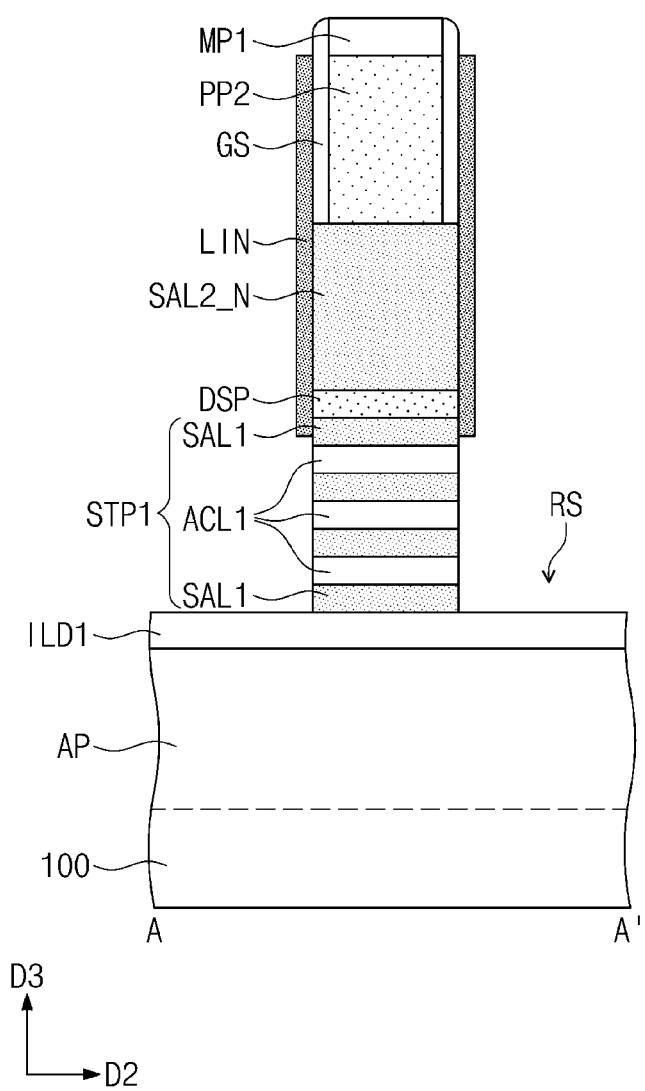
Figure 13B:
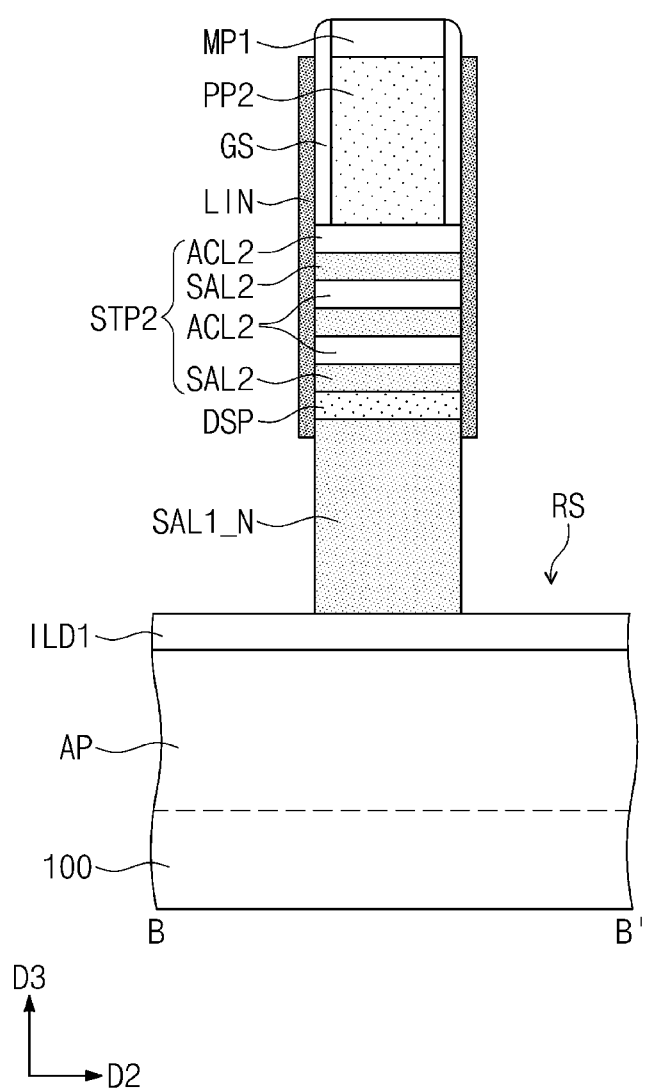
Figure 13C:
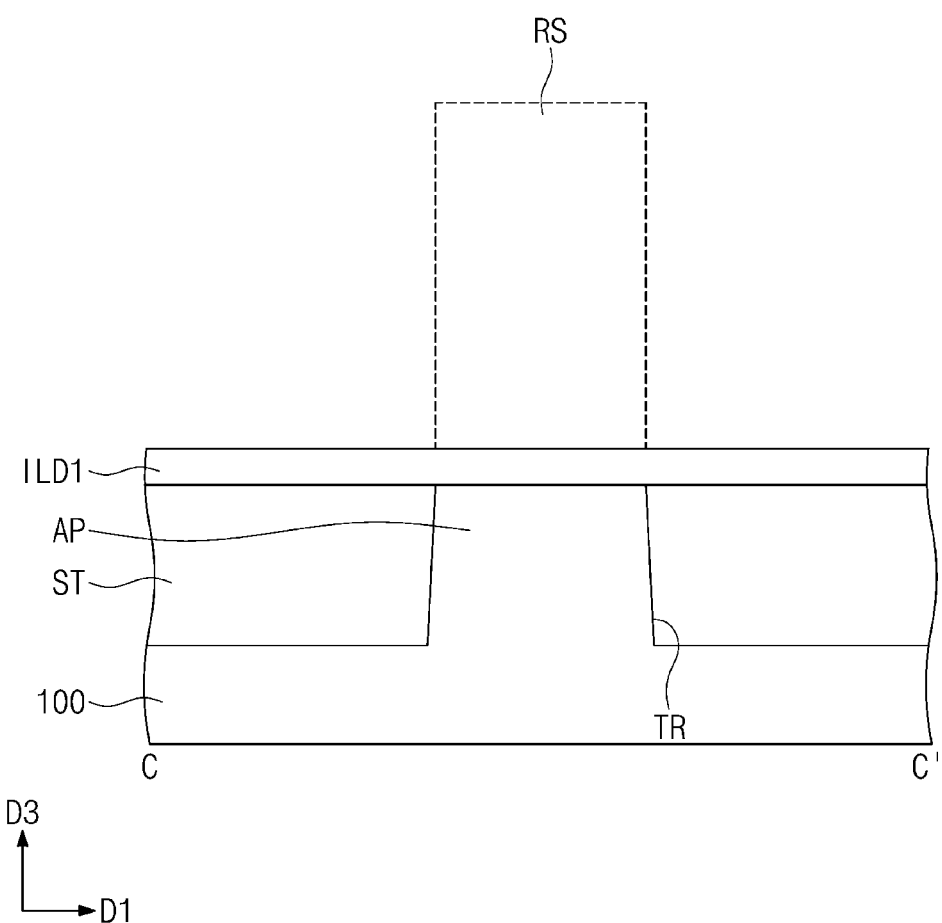

Referring to FIGS. 13A to 13C, the gate spacers GS and the first hardmask MP1 may be used as an etching mask to perform an etching process on the stack structure (see SSTR of FIG. 11). The etching process may form a pair of recesses RS on opposite sides of the each of the first and second sacrificial patterns PP1 and PP2.

Liner layers LIN may be formed on opposite sidewalls of each of the second stack pattern STP2 and the fourth sacrificial layer SAL2_N. The liner layers LIN may prevent the second stack pattern STP2 and the fourth sacrificial layer SAL2_N from being exposed by the recesses RS. The liner layers LIN may expose the first stack pattern STP1 and the second sacrificial layer SAL1_N For example, the liner layers LIN may include silicon nitride.

Figure 14A:
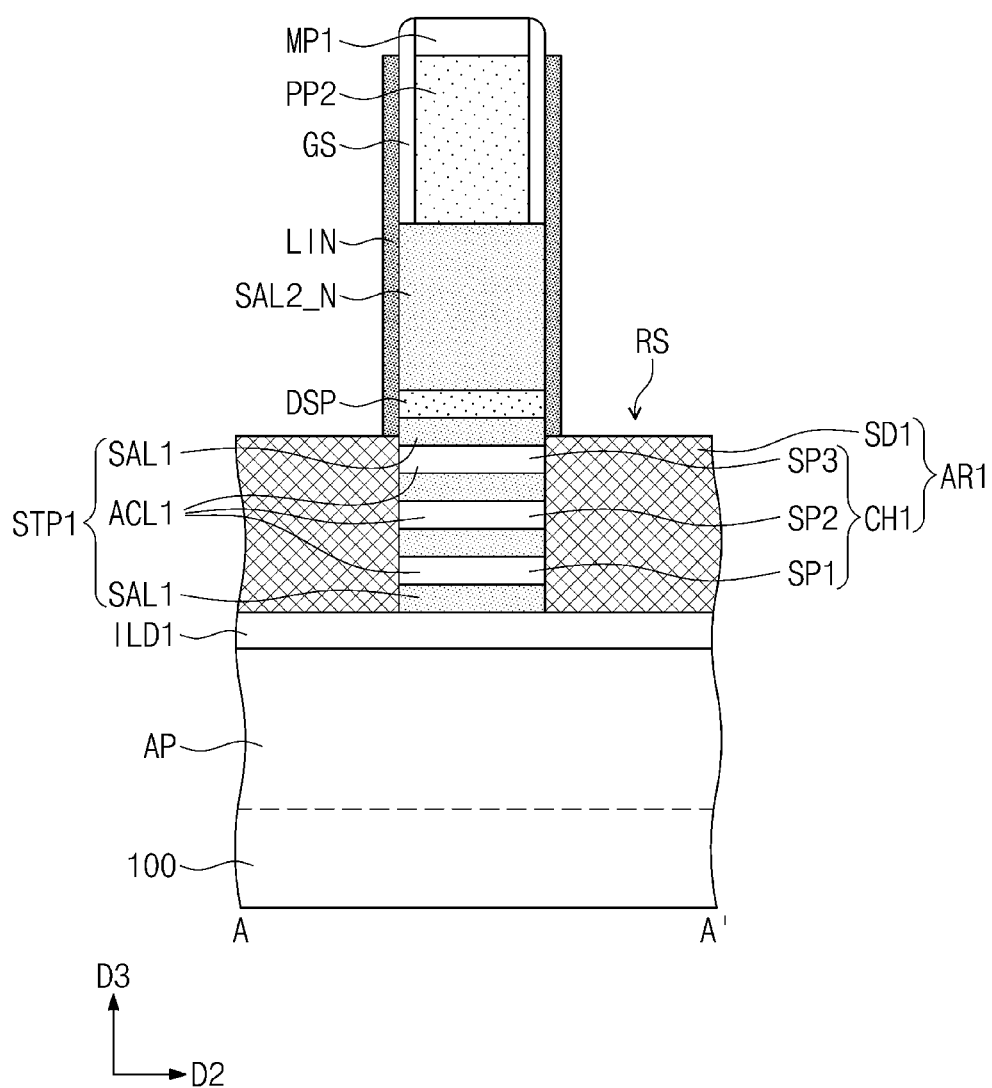
Figure 14B:
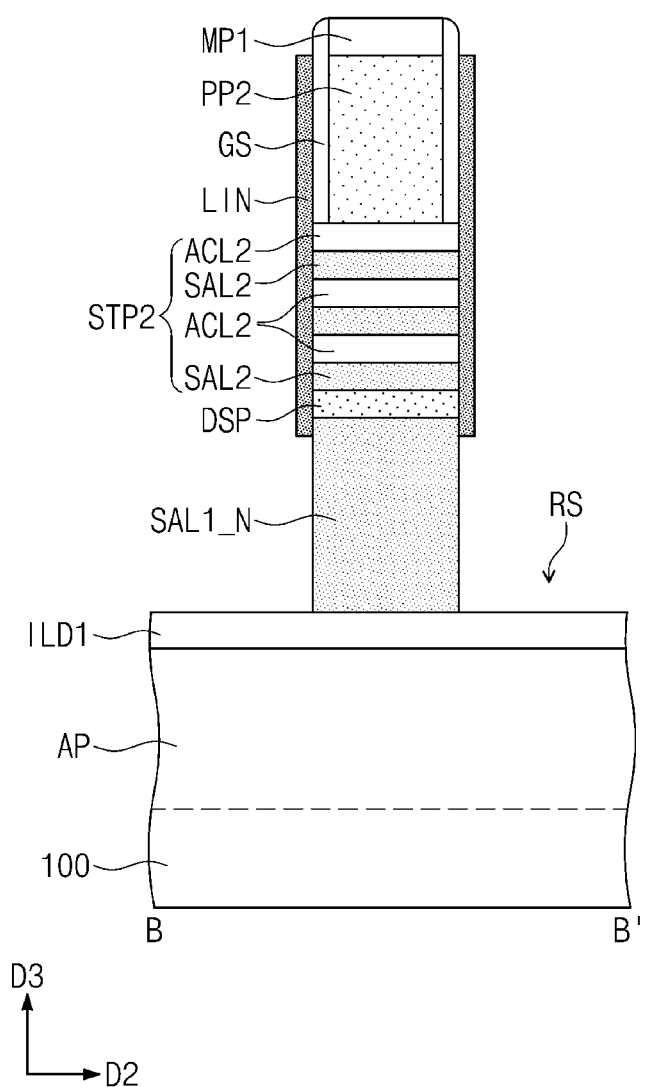
Figure 14C:
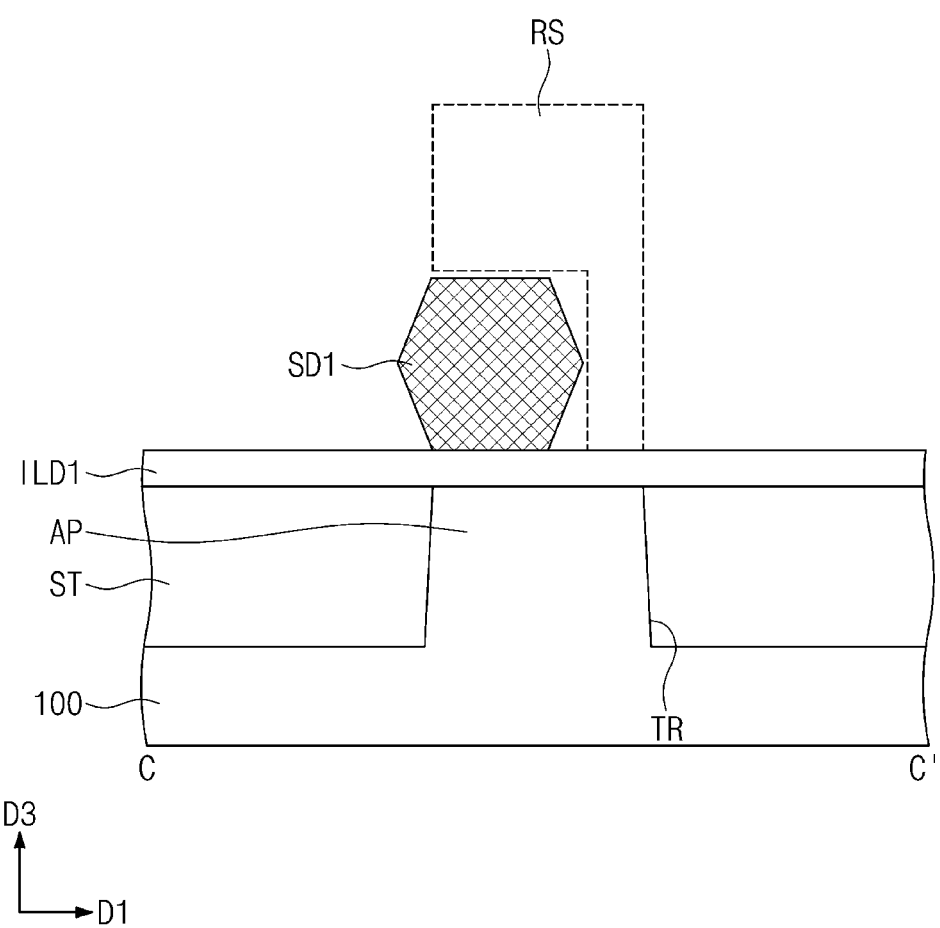

Referring to FIGS. 14A to 14C, lower source/drain patterns SD1 may be correspondingly formed in first portions of the recesses RS. For example, the lower source/drain pattern SD1 may be formed by performing a first selective epitaxial growth (SEG) process in which an exposed sidewall of the first stack pattern STP1 is used as a seed layer. The lower source/drain pattern SD1 may be grown from the seed layer or the first active layers ACL1 exposed by the recess RS. According to some embodiments, when the dielectric layer ILD1 is not formed, the lower source/drain pattern SD1 may be grown from a seed or the active pattern AP, and/or the first active layers ACL1 exposed by the recess RS. For example, the first SEG process may include chemical vapor deposition (CVD) or molecular beam epitaxy (MBE).

The lower source/drain pattern SD1 may be in-situ doped with impurities during the first SEG process. Alternatively, after the formation of the lower source/drain pattern SD1, impurities may be implanted into the lower source/drain pattern SD1. The lower source/drain pattern SD1 may be doped to have a first conductivity type (e.g., n-type).

A lower channel pattern CH1 may be defined to indicate the first active layers ACL1 interposed between a pair of lower source/drain patterns SD1. For example, the first active layers ACL1 may be formed into first, second, and third semiconductor patterns SP1, SP2, and SP3 of the lower channel pattern CH1. The lower channel pattern CH1 and the lower source/drain patterns SD1 may constitute a first active region AR1 that is a bottom tier of a three-dimensional device.

A sidewall of the second stack pattern STP2 may be provided with the liner layer LIN thereon. For example, during the first SEG process, the second active layers ACL2 of the second stack pattern STP2 may not be exposed due to the liner layer LIN. Therefore, during the first SEG process, no semiconductor layer may be separately grown on the second stack pattern STP2. The second sacrificial layer SAL1_N may not serve as a seed layer, and thus during the first SEG process, no semiconductor layer may be separately grown on the second sacrificial layer SAL1_N. For example, the lower source/drain patterns SD1 may be formed only on portions of the active pattern AP. The first active region AR1 may include a first interlayer dielectric layer 110 which will be discussed below.

Figure 15A:
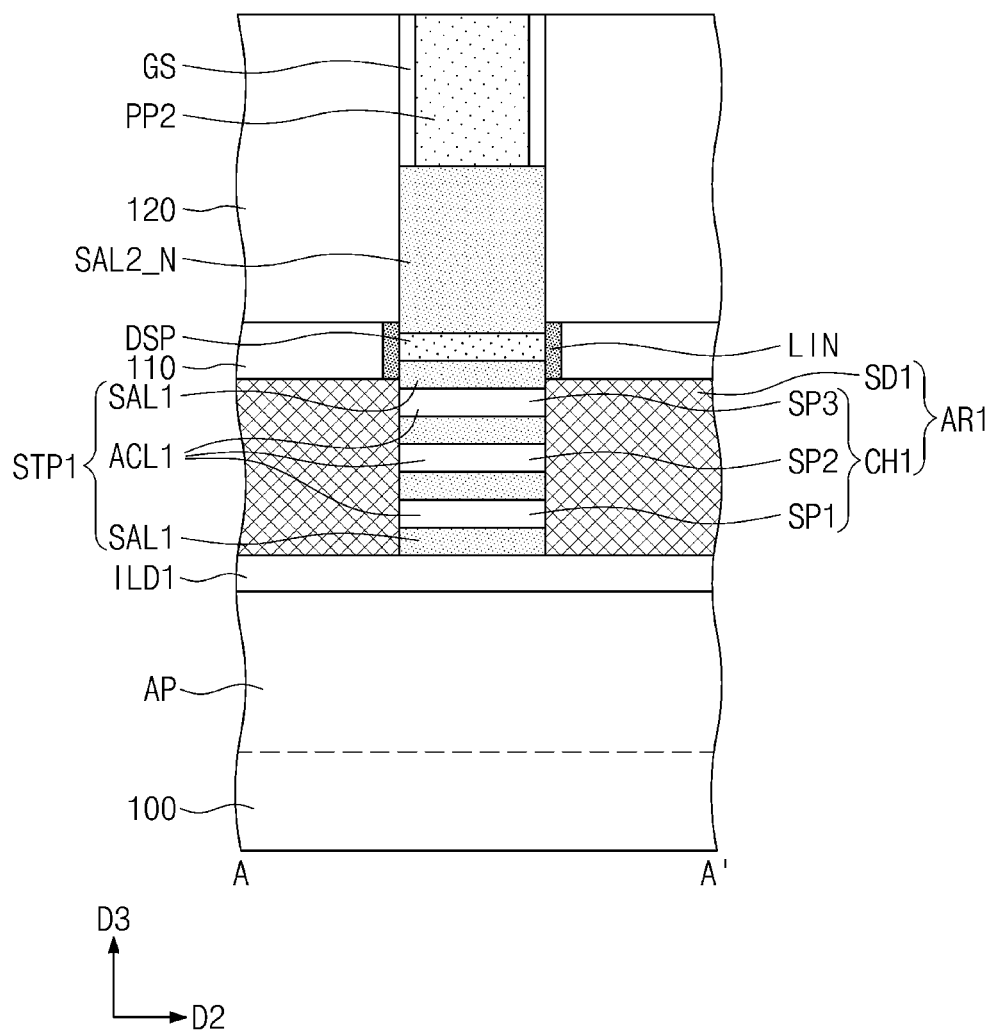
Figure 15B:
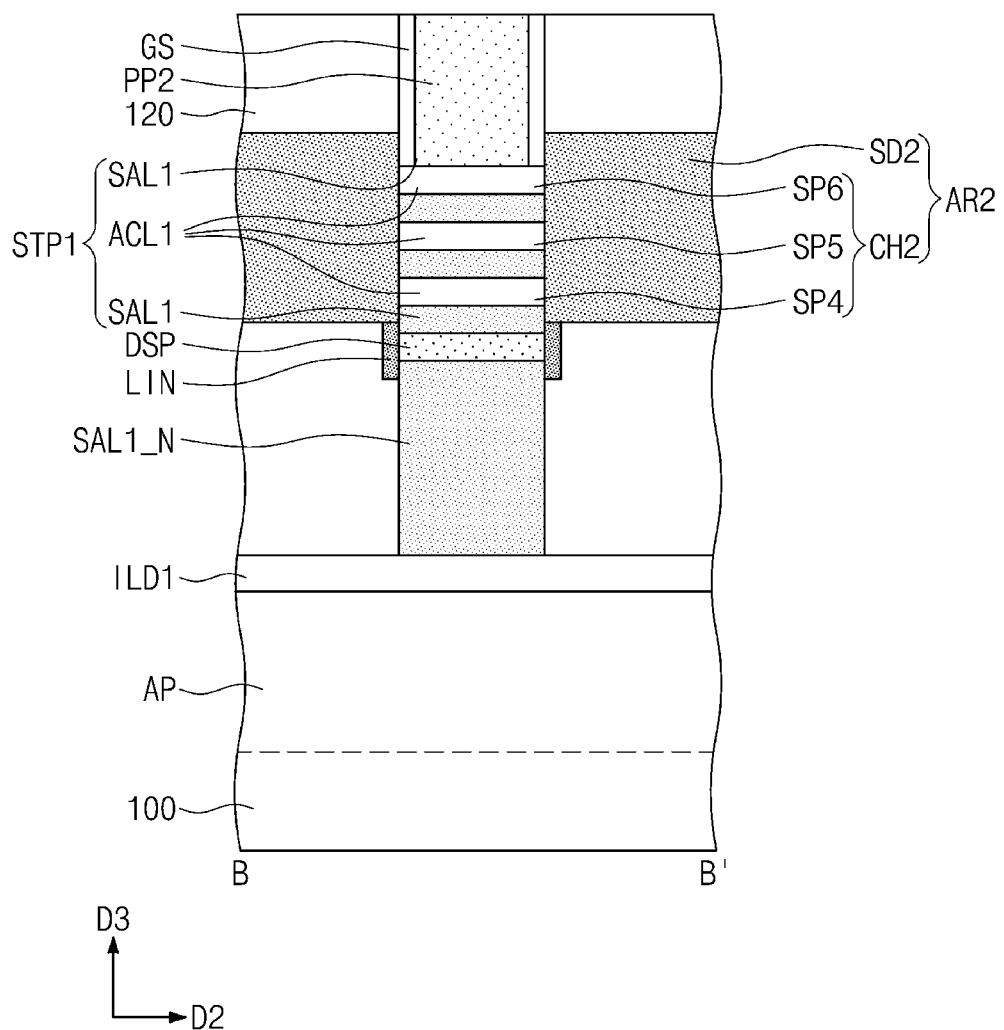
Figure 15C:
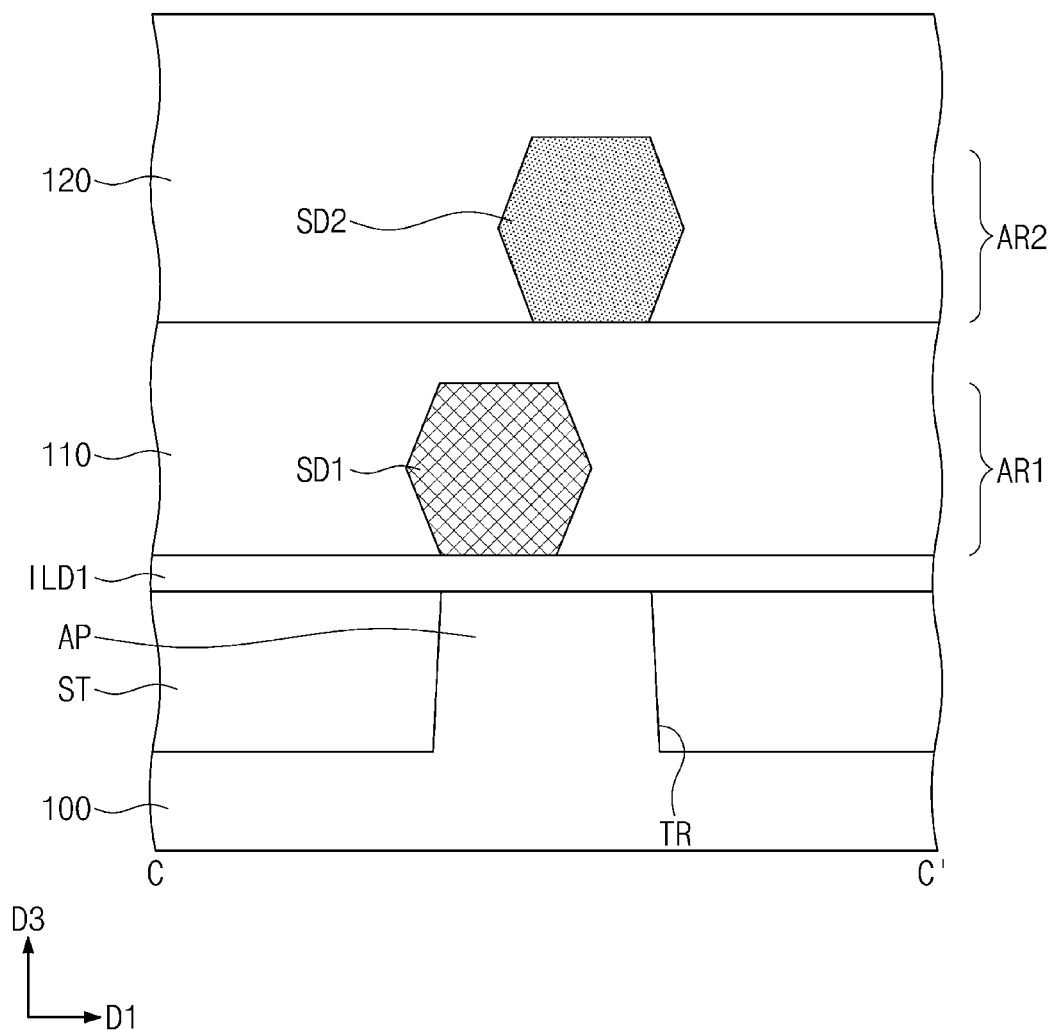

Referring to FIGS. 15A to 15C, a first interlayer dielectric layer 110 may be formed on the lower source/drain patterns SD1. The first interlayer dielectric layer 110 may be recessed to have a top surface lower than a bottom surface of a lowermost second active layer ACL2.

The liner layer LIN exposed to the first recess RS1 may be partially removed. The liner layer LIN provided with the first interlayer dielectric layer 110 thereon may be formed on a sidewall of the dummy channel pattern DSP. The removal of the liner layer LIN may allow the recess RS to expose the second active layers ACL2.

Upper source/drain patterns SD2 may be formed on opposite sidewalls of each of the second stack pattern STP2. For example, the upper source/drain pattern SD2 may be formed by performing a second SEG process in which a sidewall of the second stack pattern STP2 is used as a seed layer. The upper source/drain pattern SD2 may be grown from a seed or the second active layers ACL2 exposed by the recess RS. The upper source/drain patterns SD2 may be doped to have a second conductivity type (e.g., p-type) different from the first conductivity type.

An upper channel pattern CH2 may be constituted by the second active layers ACL2 interposed between a pair of upper source/drain patterns SD2. For example, the second active layers ACL2 may be formed into fourth, fifth, and sixth semiconductor patterns SP4, SP5, and SP6 of the upper channel pattern CH2. The upper channel pattern CH2 and the upper source/drain patterns SD2 may constitute a second active region AR2 that is an upper tier of a three-dimensional device.

A second interlayer dielectric layer 120 may be formed on the first hardmask MP1, the gate spacers GS, and the upper source/drain patterns SD2. For example, the second interlayer dielectric layer 120 may include a silicon oxide layer.

The second interlayer dielectric layer 120 may be planarized until a top surface of the second sacrificial pattern PP2 is exposed. An etch-back or chemical mechanical polishing (CMP) process may be employed to planarize the second interlayer dielectric layer 120. During the planarization process, the first hardmask MP1 may be completely removed. As a result, the second interlayer dielectric layer 120 may have a top surface coplanar with that of the second sacrificial pattern PP2 and those of the gate spacers GS.

Figure 16:
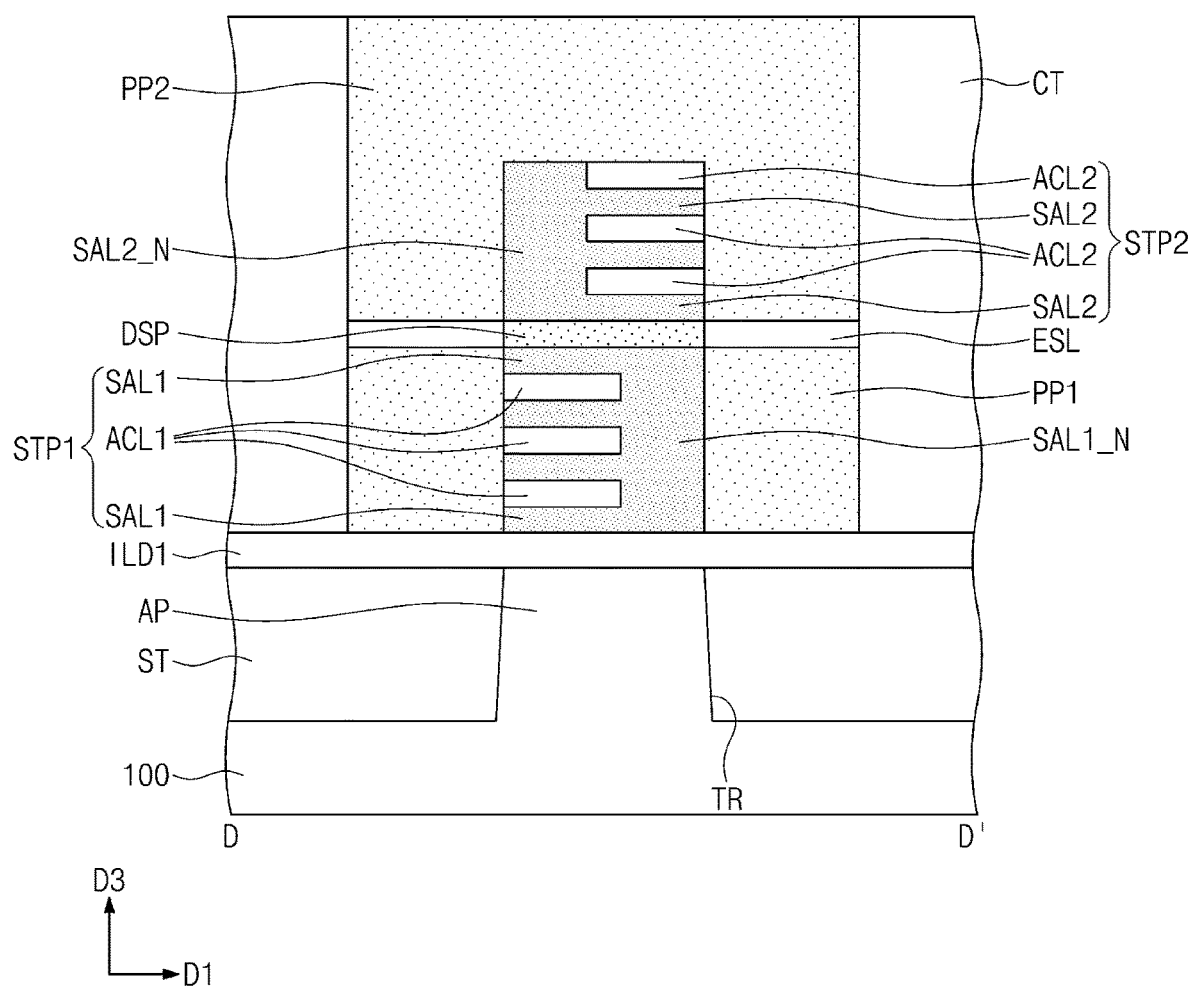

Referring to FIGS. 3 and 16, gate cutting patterns CT may be formed to penetrate the first and second sacrificial patterns PP1 and PP2. The gate cutting patterns CT may be formed on first and second cell boundaries CB1 and CB2 of a logic cell LC. The gate cutting patterns CT may include one or more of a silicon oxide layer and a silicon nitride layer.

Figure 17:
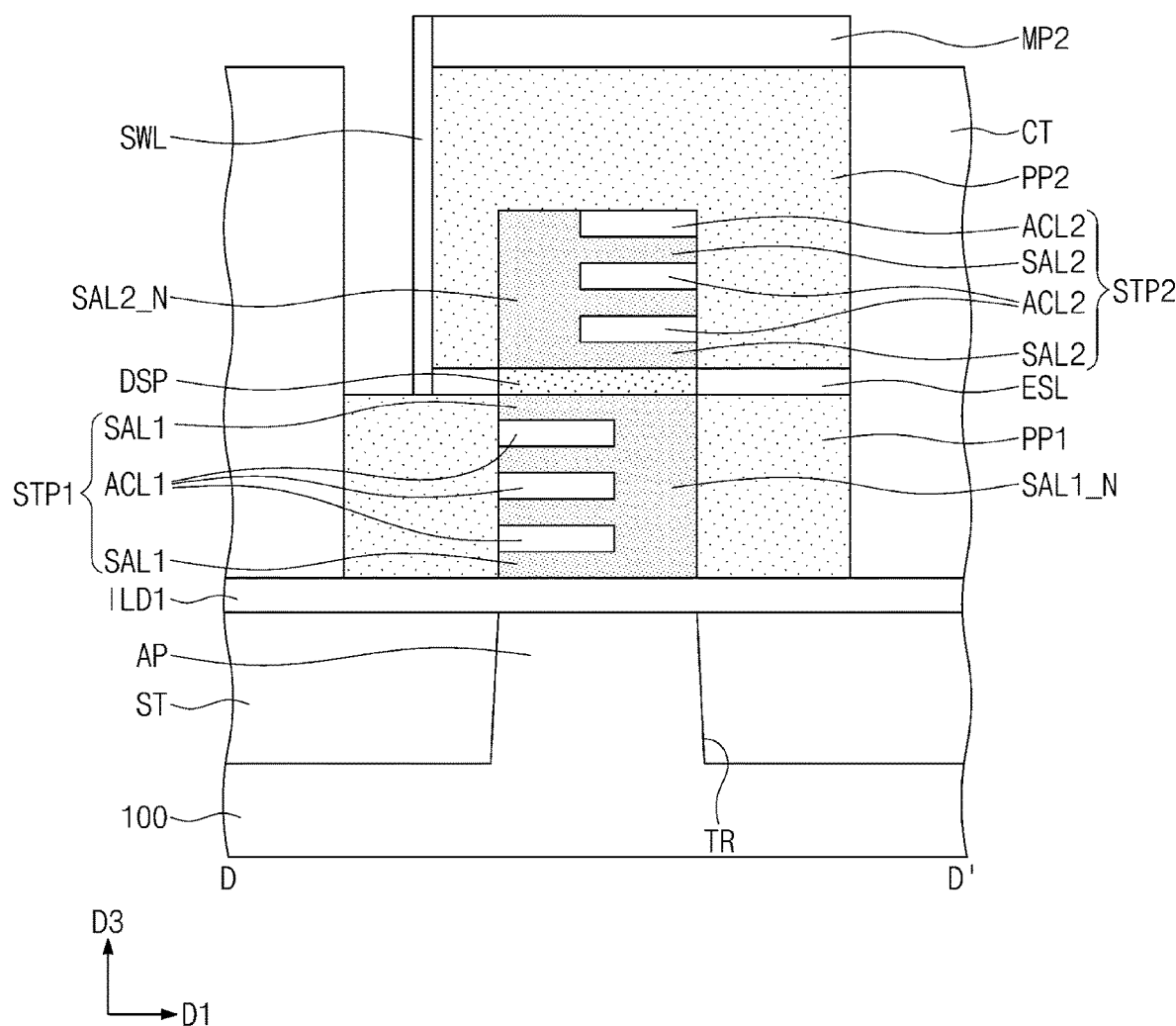

Referring to FIG. 17, a portion of the second sacrificial pattern PP2 may be etched to expose an upper portion of the first sacrificial pattern PP1. For example, the exposing the upper portion of the first sacrificial pattern PP1 may include forming a second hardmask MP2 on the second sacrificial pattern PP2, and using the second hardmask MP2 as an etching mask to etch the second sacrificial pattern PP2 and the etch stop layer ESL. A sidewall layer SWL may be conformally formed on lateral surfaces of the etch stop layer ESL and the second sacrificial pattern PP2 that are not etched. The sidewall SWL may protect the second sacrificial pattern PP2 and the etch stop layer ESL in the procedure of selective etching of the exposed first sacrificial pattern PP1.

Figure 18A:
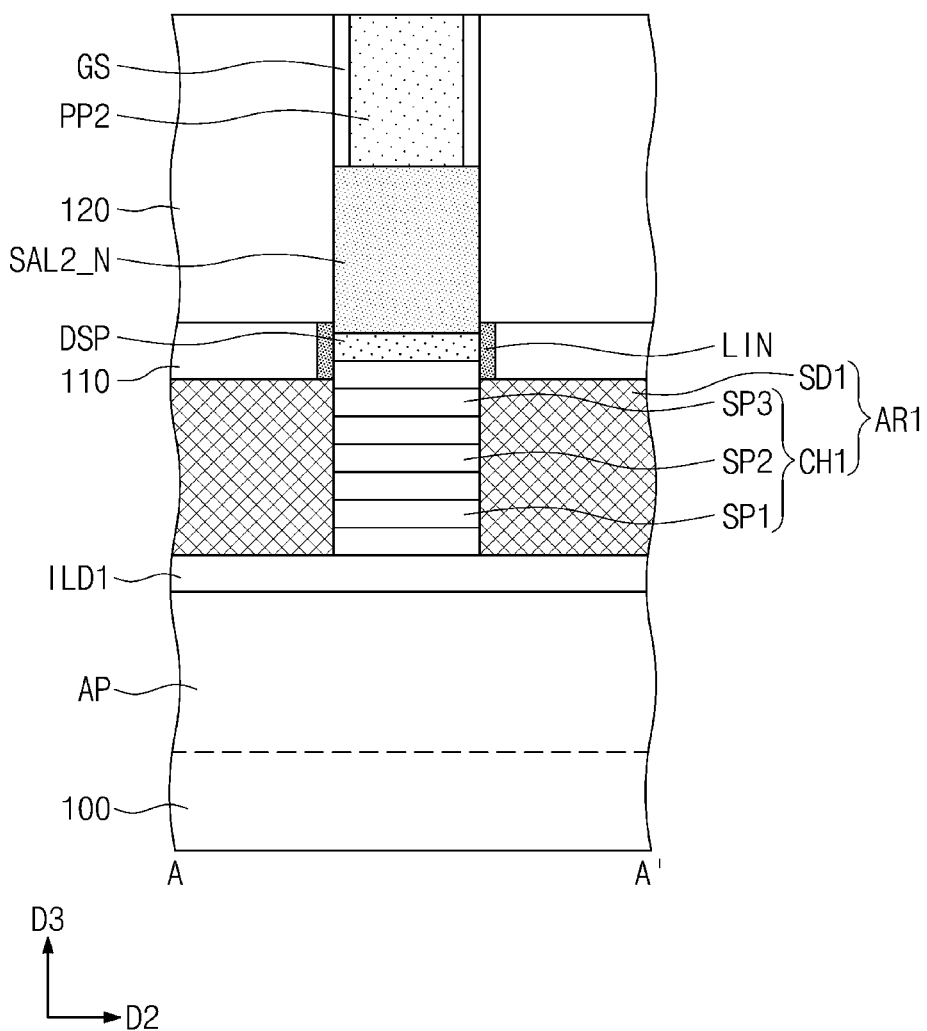
Figure 18B:
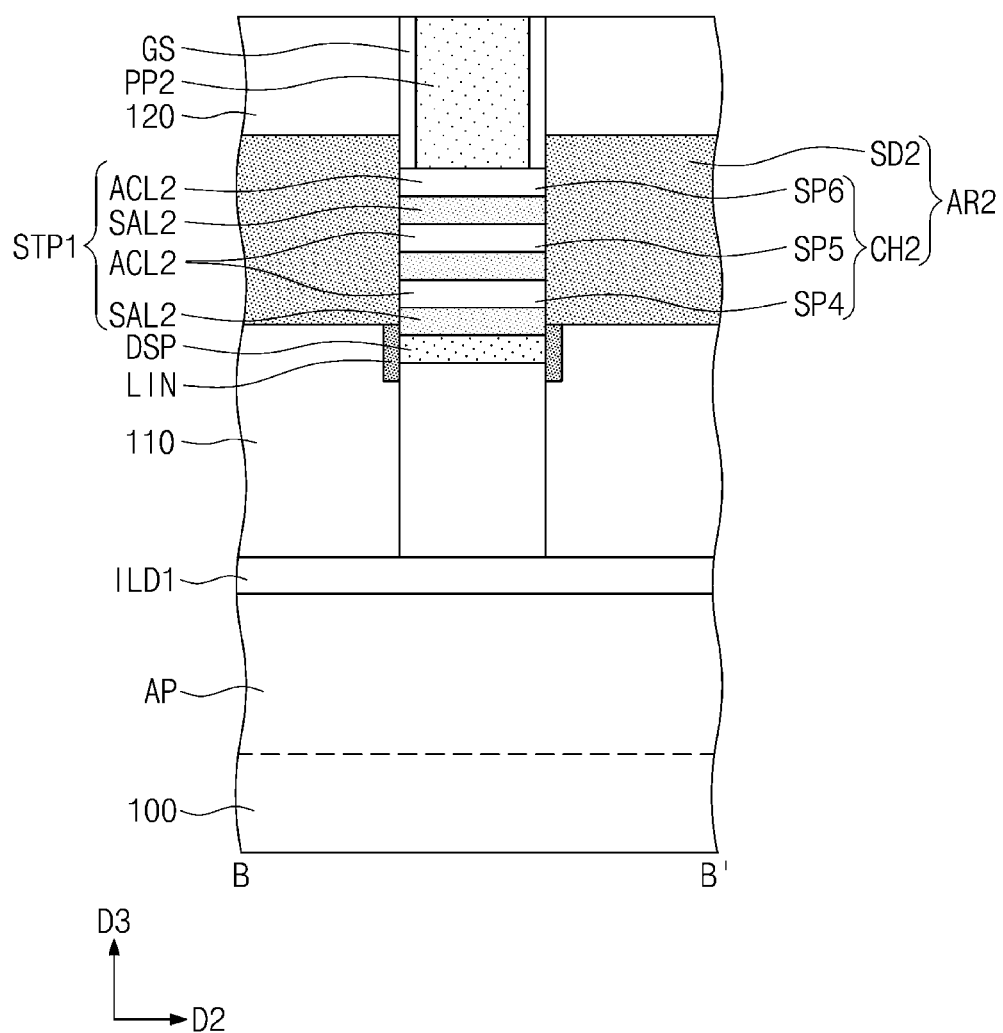
Figure 18C:
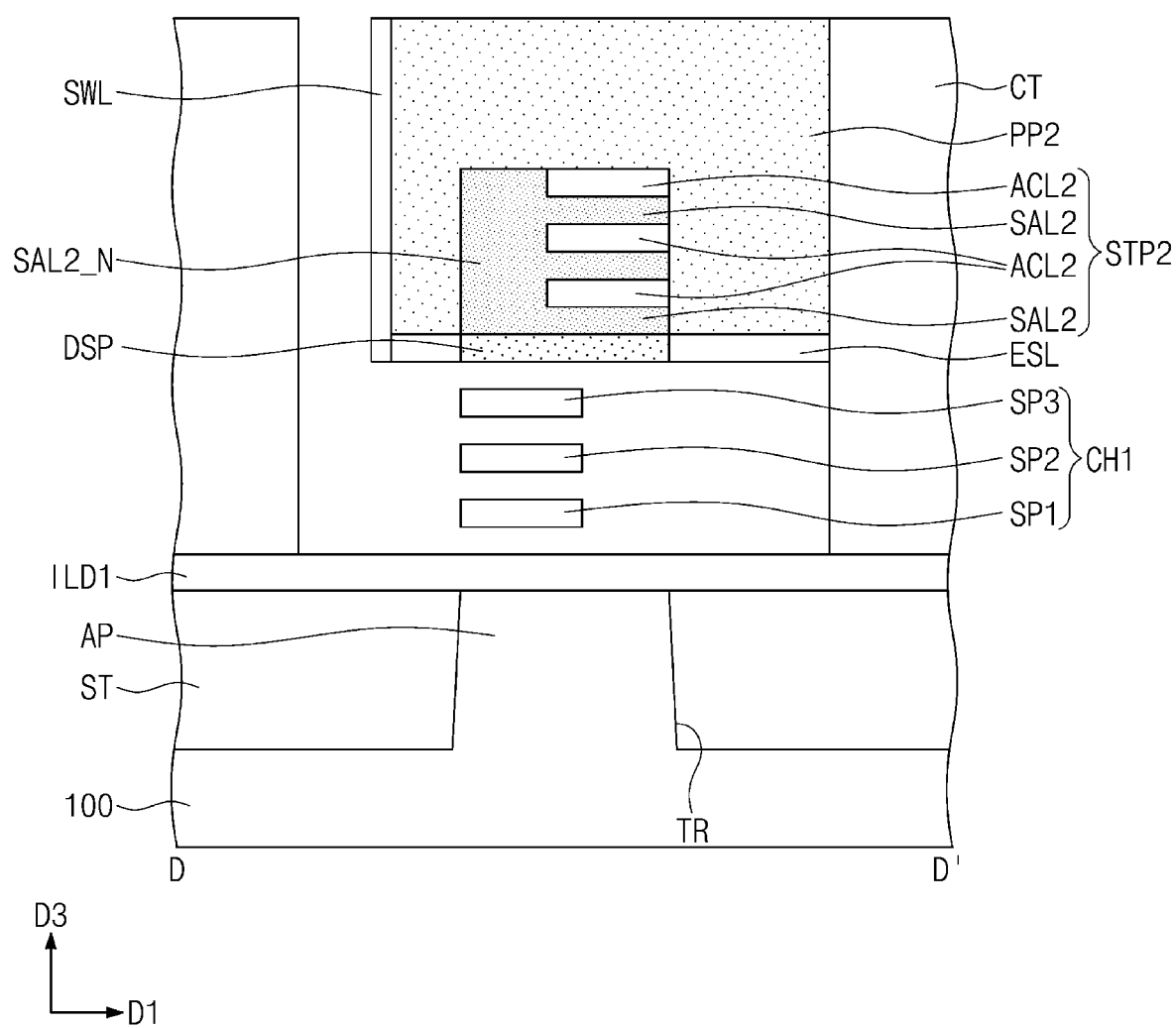

Referring to FIGS. 18A to 18C, the exposed first sacrificial pattern PP1 may be selectively removed. The removal of the first sacrificial pattern PP1 may form a region that exposes the lower channel pattern CH1. The removal of the first sacrificial pattern PP1 may include performing a wet etching process using an etchant that selectively etches polysilicon.

In some embodiments, the exposed separation layer DSL may be replaced with a dummy channel pattern DSP. In some embodiments, the separation layer DSL may remain to constitute the dummy channel pattern DSP.

The first and second sacrificial layers SAL1 and SAL1_N may be selectively removed which are exposed while the first sacrificial pattern PP1 is removed. Thus, empty spaces may be correspondingly formed between the lower channel patterns CH1. For example, an etching process may be performed in which the first and second sacrificial layers SAL1 and SAL1_N are selectively etched, such that the first and second sacrificial layers SAL1 and SAL1_N may be removed while leaving the first to third semiconductor patterns SP1 to SP3 and the dummy channel pattern DSP. The etching process may have a high etch rate with respect to a silicon-germanium layer whose germanium concentration is relatively high. For example, the etching process may have a high etch rate with respect to silicon-germanium whose germanium concentration is greater than about 10 at %. The selective removal of the first and second sacrificial layers SAL1 and SAL1_N may allow the first, second, and third semiconductor patterns SP1, SP2, and SP3 to remain on the first active region AR1.

Figure 19A:
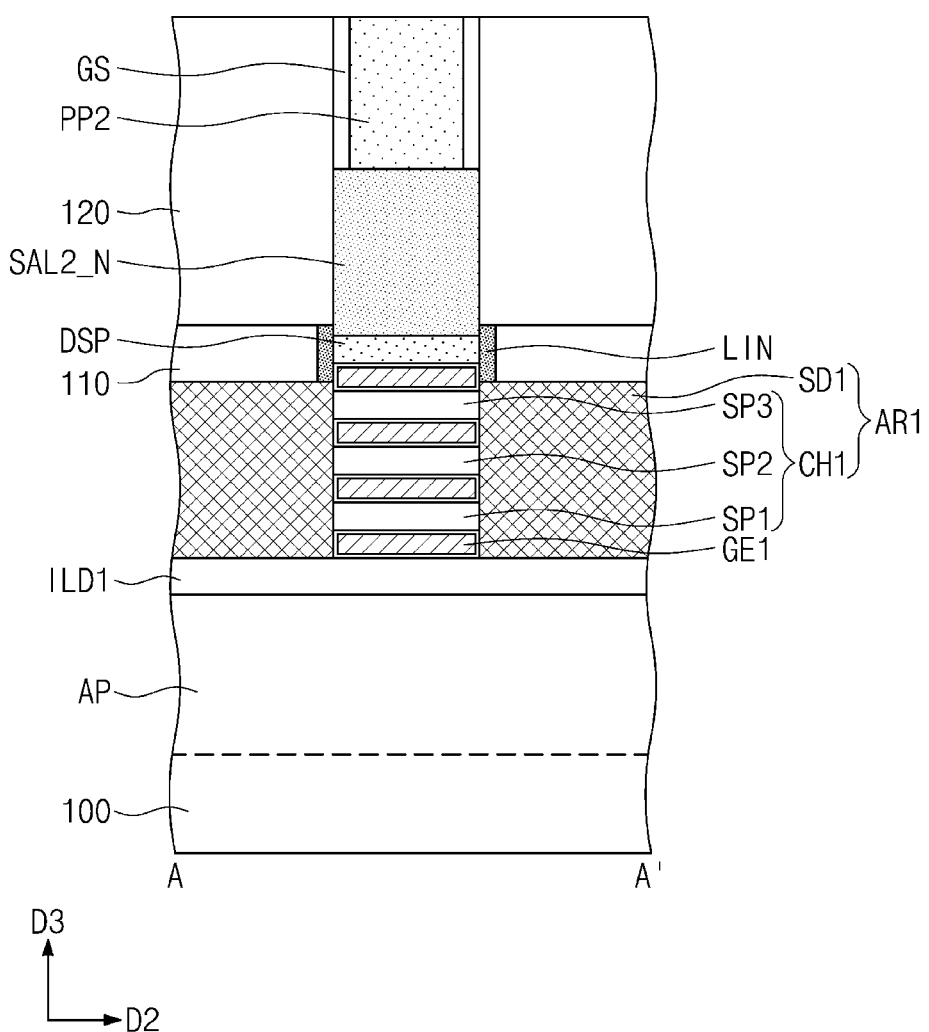
Figure 19B:
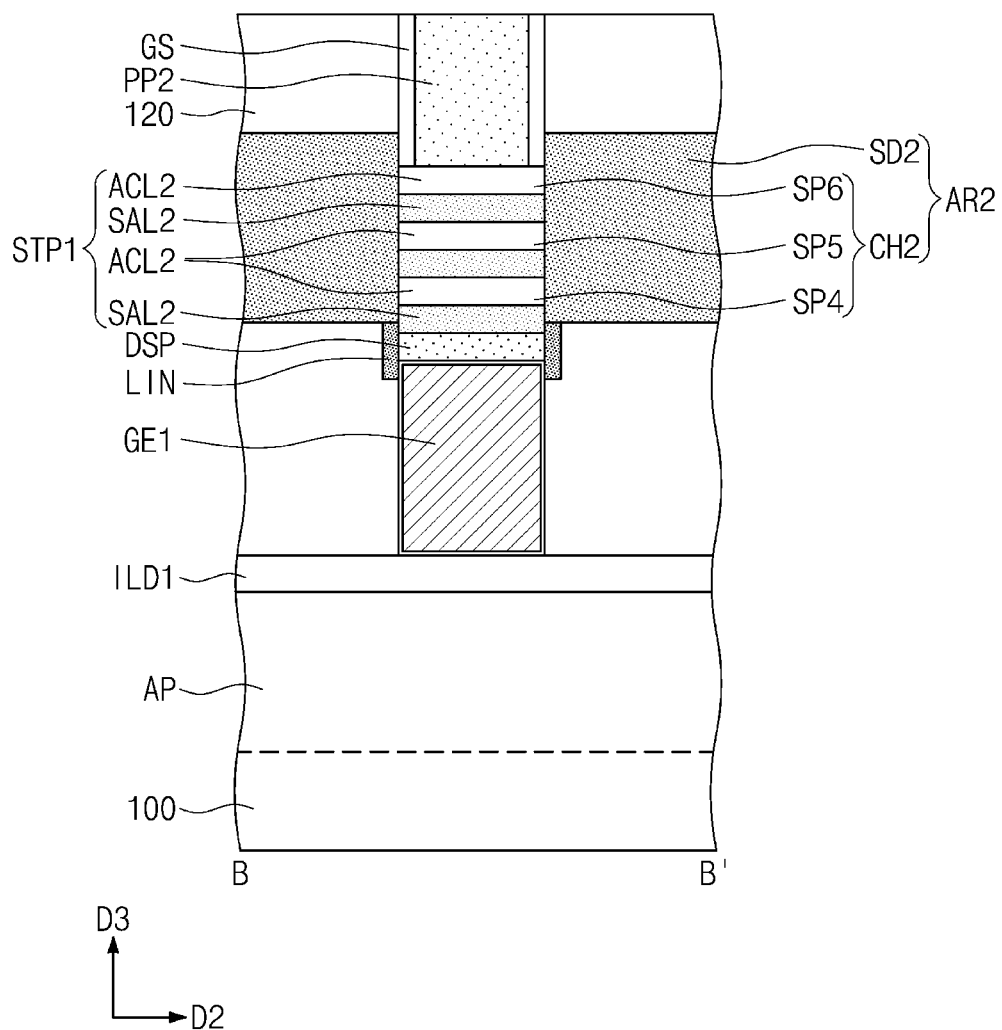
Figure 19C:
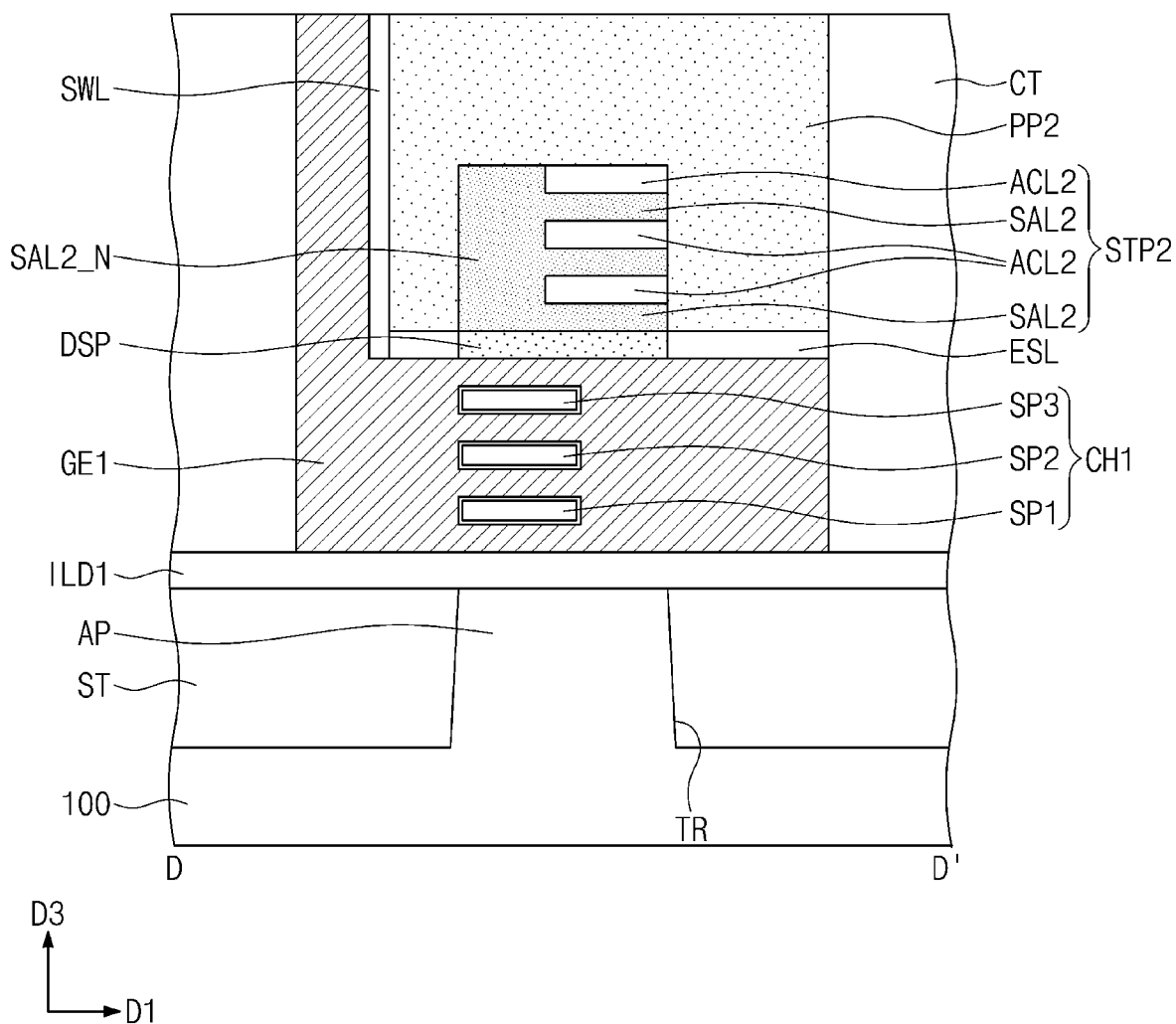

Referring to FIGS. 19A to 19C, a gate dielectric layer GI may be conformally formed on the exposed first to third semiconductor patterns SP1 to SP3. A first gate electrode GE1 may be formed on the gate dielectric layer GI. The formation of the first gate electrode GE1 may include forming first to fourth portions (see PO1 to PO4 of FIG. 4D).

Figure 20A:
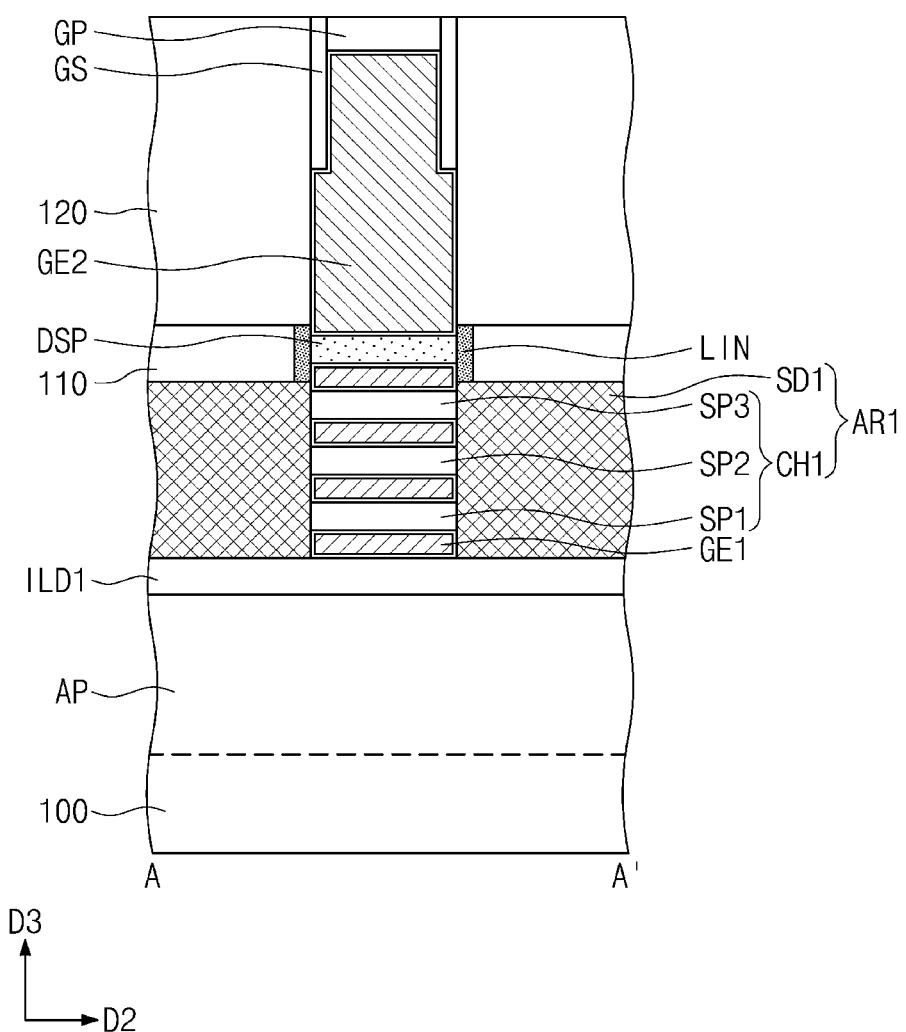
Figure 20B:
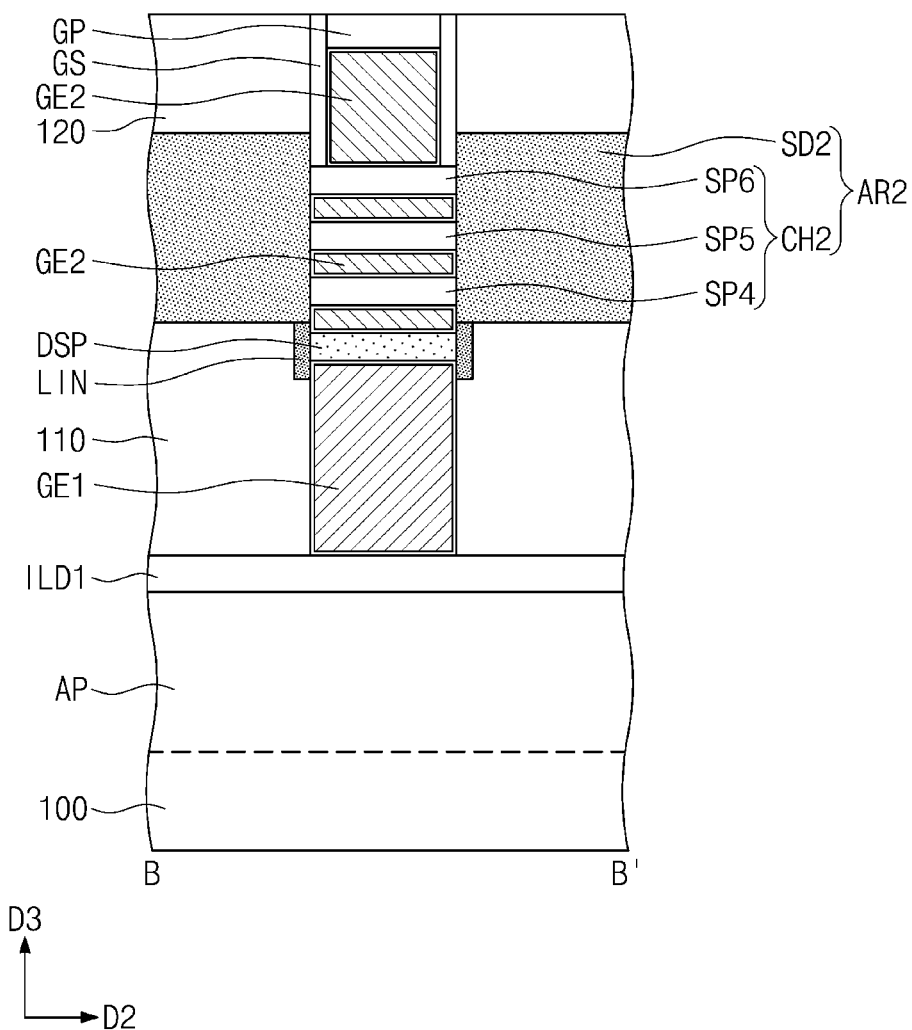
Figure 20C:
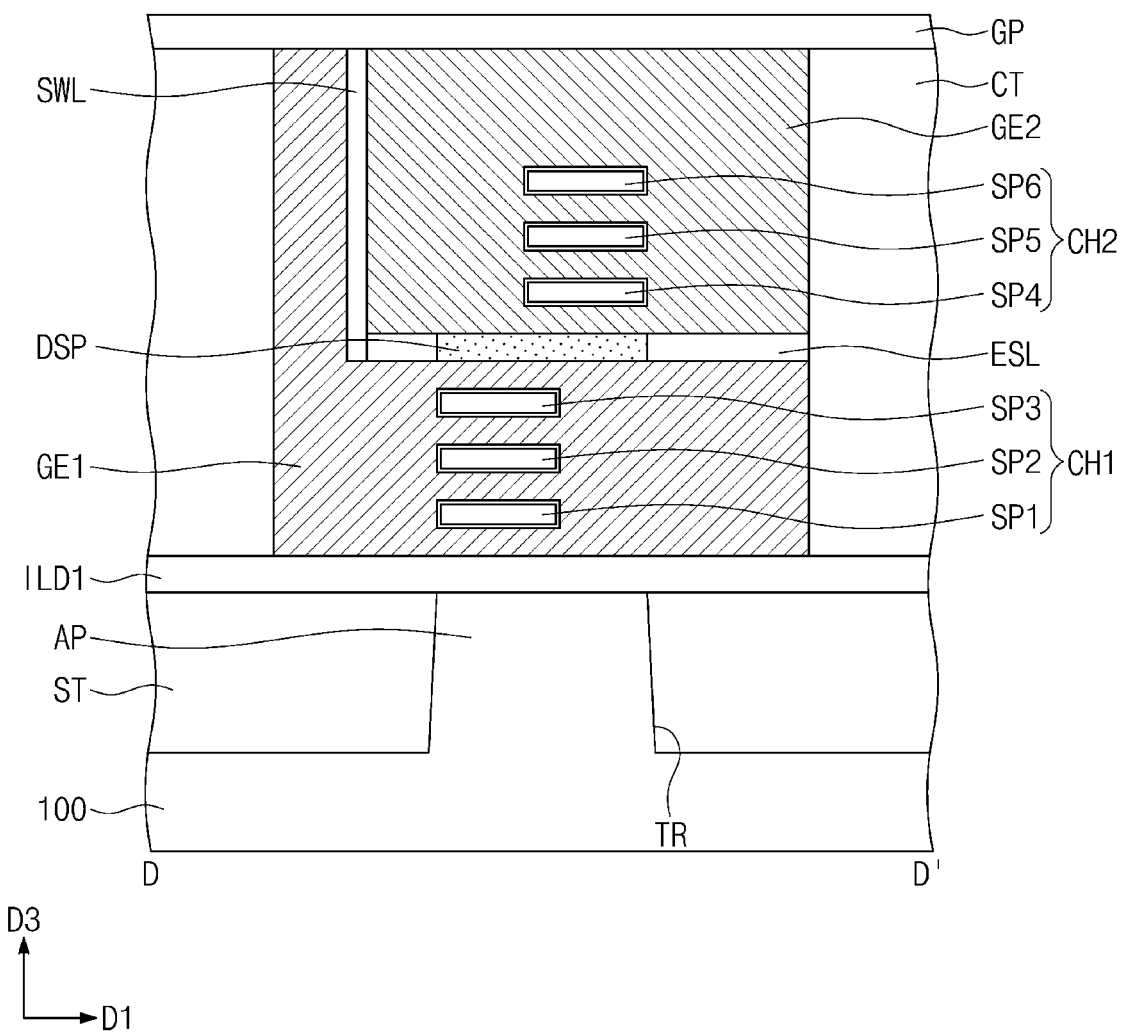
Figure 21A:
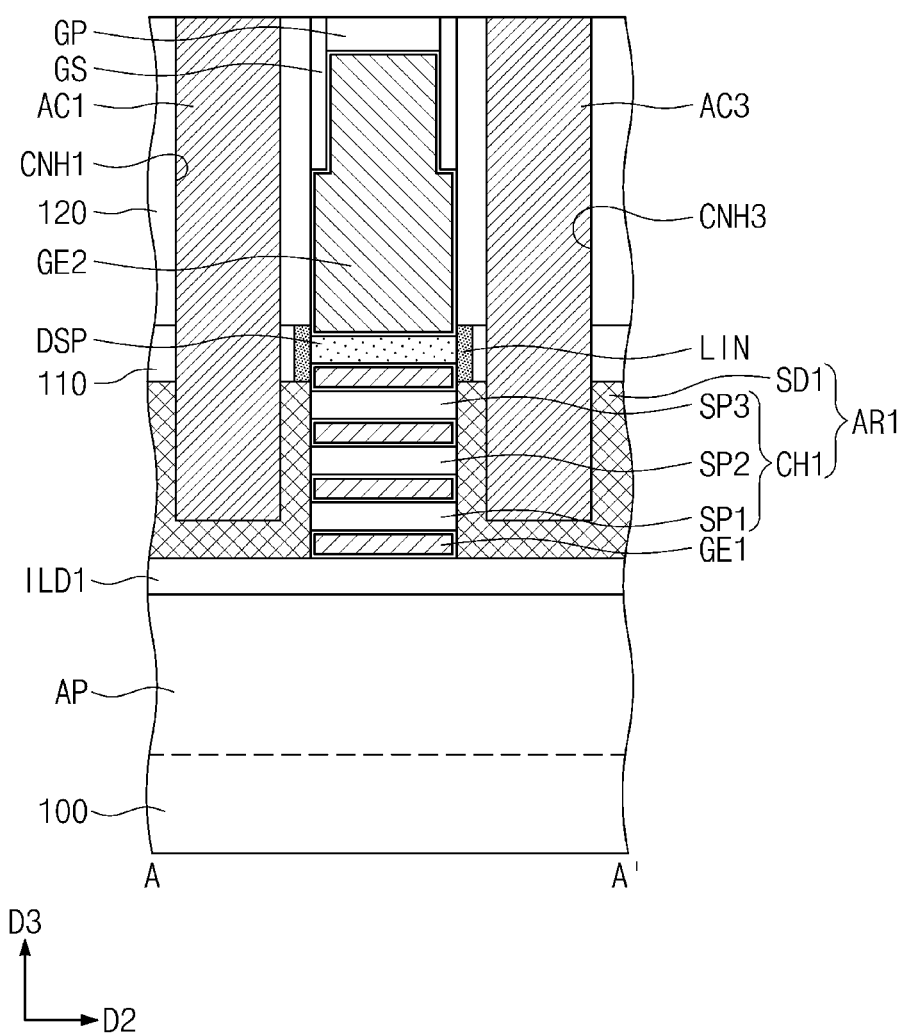
Figure 21B:
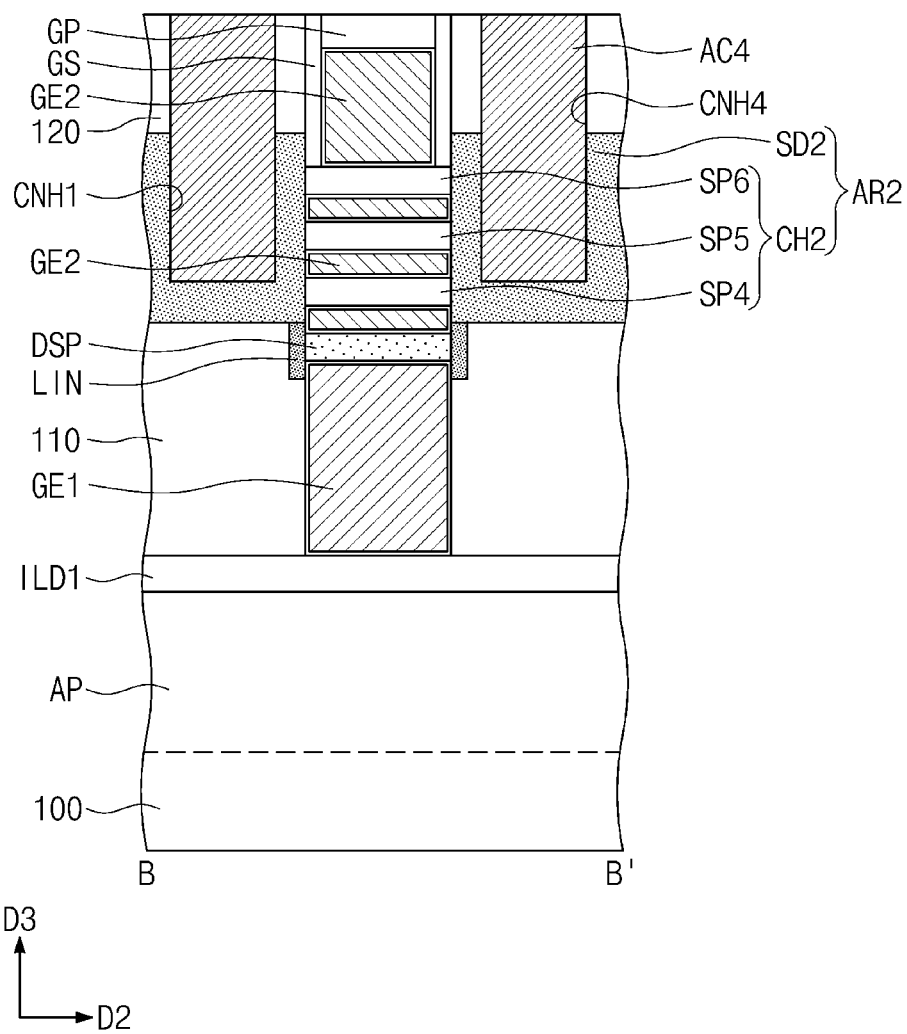
Figure 21C:
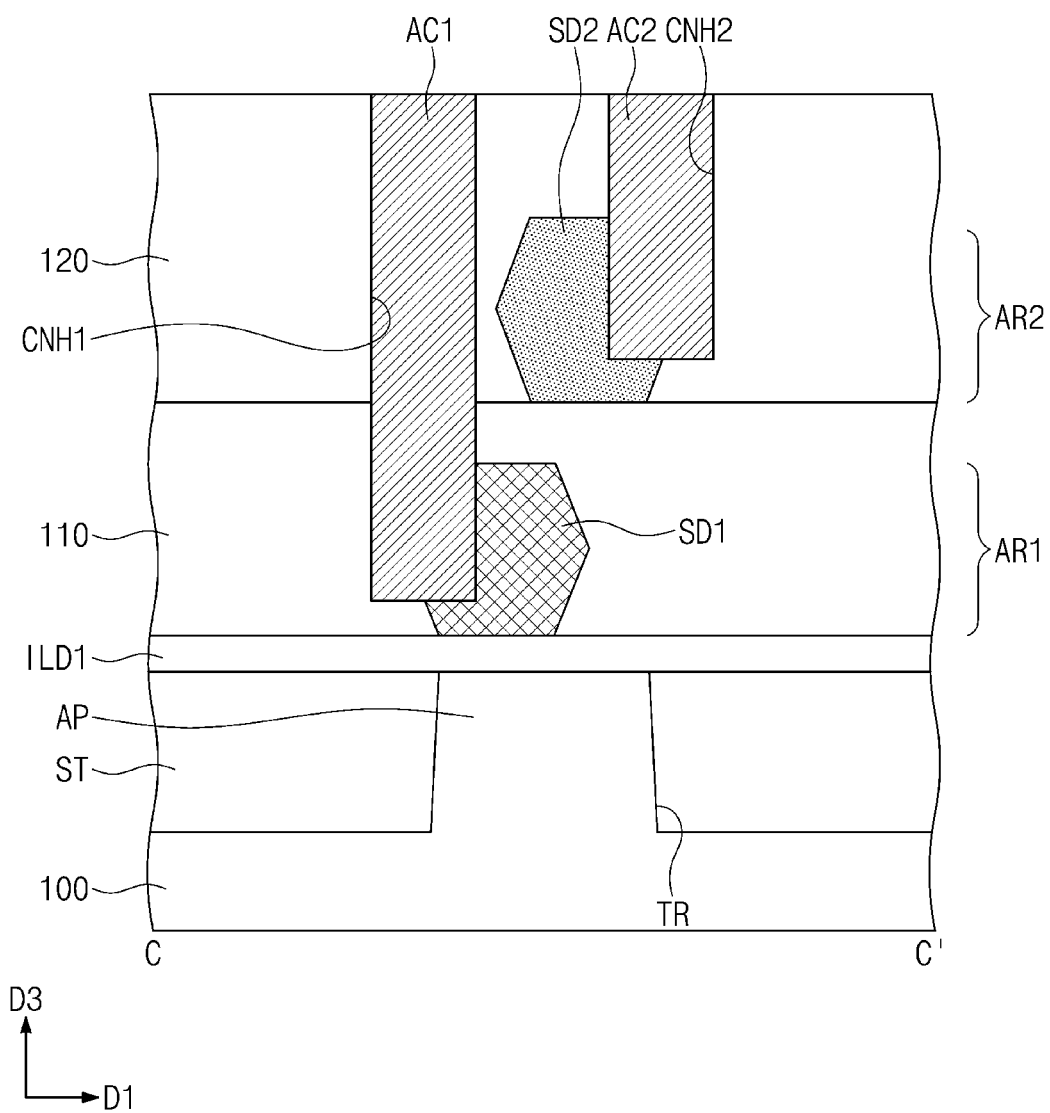

Referring to FIGS. 20A to 20C, the exposed second sacrificial pattern PP2 may be selectively removed. In this case, a capping layer may be formed on an upper portion of the first gate electrode GE1, thereby preventing loss of the first gate electrode GE1. The removal of the second sacrificial pattern PP2 may form a region that exposes the upper channel pattern CH2. The removal of the second sacrificial pattern PP2 may include performing a wet etching process using an etchant that selectively etches polysilicon.

The third and fourth sacrificial layers SAL2 and SAL2_N may be selectively removed which are exposed while the second sacrificial pattern PP2 is removed. Therefore, empty spaces may be correspondingly formed between the upper channel patterns CH2. For example, an etching process may be performed in which the third and fourth sacrificial layers SAL2 and SAL2_N are selectively etched, such that the third and fourth sacrificial layers SAL2 and SAL2_N may be removed while leaving the fourth to sixth semiconductor patterns SP4 to SP6. The etching process may have a high etch rate with respect to a silicon-germanium layer whose germanium concentration is relatively high. For example, the etching process may have a high etch rate with respect to silicon-germanium whose germanium concentration is greater than about 10 at %. The selective removal of the third and fourth sacrificial layers SAL2 and SAL2_N may allow the fourth, fifth, and sixth semiconductor patterns SP4, SP5, and SP6 to remain on the second active region AR2.

A gate dielectric layer GI may be conformally formed on the exposed fourth to sixth semiconductor patterns SP4 to SP6. A second gate electrode GE2 may be formed on the gate dielectric layer GI. The formation of the second gate electrode GE2 may include forming fifth to eighth portions (see PO5 to PO8 of FIG. 4D).

The first and second gate electrodes GE1 and GE2 may be recessed to have their reduced heights. Gate capping patterns GP may be formed on the recessed first and second gate electrodes GE1 and GE2. The gate capping pattern GP may undergo a planarization process to allow the gate capping pattern GP to have a top surface coplanar with that of the second interlayer dielectric layer 120.

Referring to FIGS. 3 and 21A to 21C, first to fourth contact holes CNH1 to CNH4 may be formed on sides of the first and second gate electrodes GE1 and GE2. The first to fourth contact holes CNH1 to CNH4 may respectively correspond to the first to fourth active contacts AC1 to AC4 of FIG. 3.

The first and third contact holes CNH1 and CNH3 may extend from the top surface of the second interlayer dielectric layer 120 through the second interlayer dielectric layer 120 to the lower source/drain pattern SD1. The second and fourth contact holes CNH2 and CNH4 may extend from the top surface of the second interlayer dielectric layer 120 through the second interlayer dielectric layer 120 to the upper source/drain pattern SD2. Therefore, the first to fourth contact holes CNH1 to CNH4 may expose the lower and upper source/drain patterns SD1 and SD2.

In an embodiment, neither the first contact hole CNH1 nor the third contact hole CNH3 may completely penetrate the lower source/drain pattern SD1. Neither the second contact hole CNH2 nor the fourth contact hole CNH4 may completely penetrate the upper source/drain pattern SD2. Therefore, each of the first to fourth contact holes CNH1 to CNH4 may have a bottom surface located at a level between bottom and top surfaces of the lower and upper source/drain patterns SD1 and SD2. The level of the bottom surfaces of the first and third contact holes CNH1 and CNH3 may be lower than the bottom surfaces of the second and fourth contact holes CNH2 and CNH4.

Referring back to FIGS. 4C and 21C, a first central line C1 of the lower source/drain pattern SD1 may be offset in the first direction D1 from a second central line C2 of the upper source/drain pattern SD2. Thus, the first contact hole CNH1 may be spaced apart from the upper source/drain pattern SD2 and connected only to the lower source/drain pattern SD1 among the first and second source/drain patterns SD1 and SD2.

The first to fourth contact holes CNH1 to CNH4 may be filled with a conductive material to form first to fourth active contacts AC1 to AC4. The first to fourth active contacts AC1 to AC4 may be simultaneously formed in one process in which the first to fourth contact holes CNH1 to CNH4 are filled with a conductive material.

Referring back to FIGS. 3 and 4A to 4D, a third interlayer dielectric layer 130 may be formed on the second interlayer dielectric layer 120. Gate contacts GC may be formed to penetrate the third interlayer dielectric layer 130 and the gate capping pattern GP to be coupled to the first and second gate electrodes GE1 and GE2. The third interlayer dielectric layer 130 may be provided therein with connection lines CNL correspondingly connected to the first to fourth active contacts AC1 to AC4.

Figure 22:
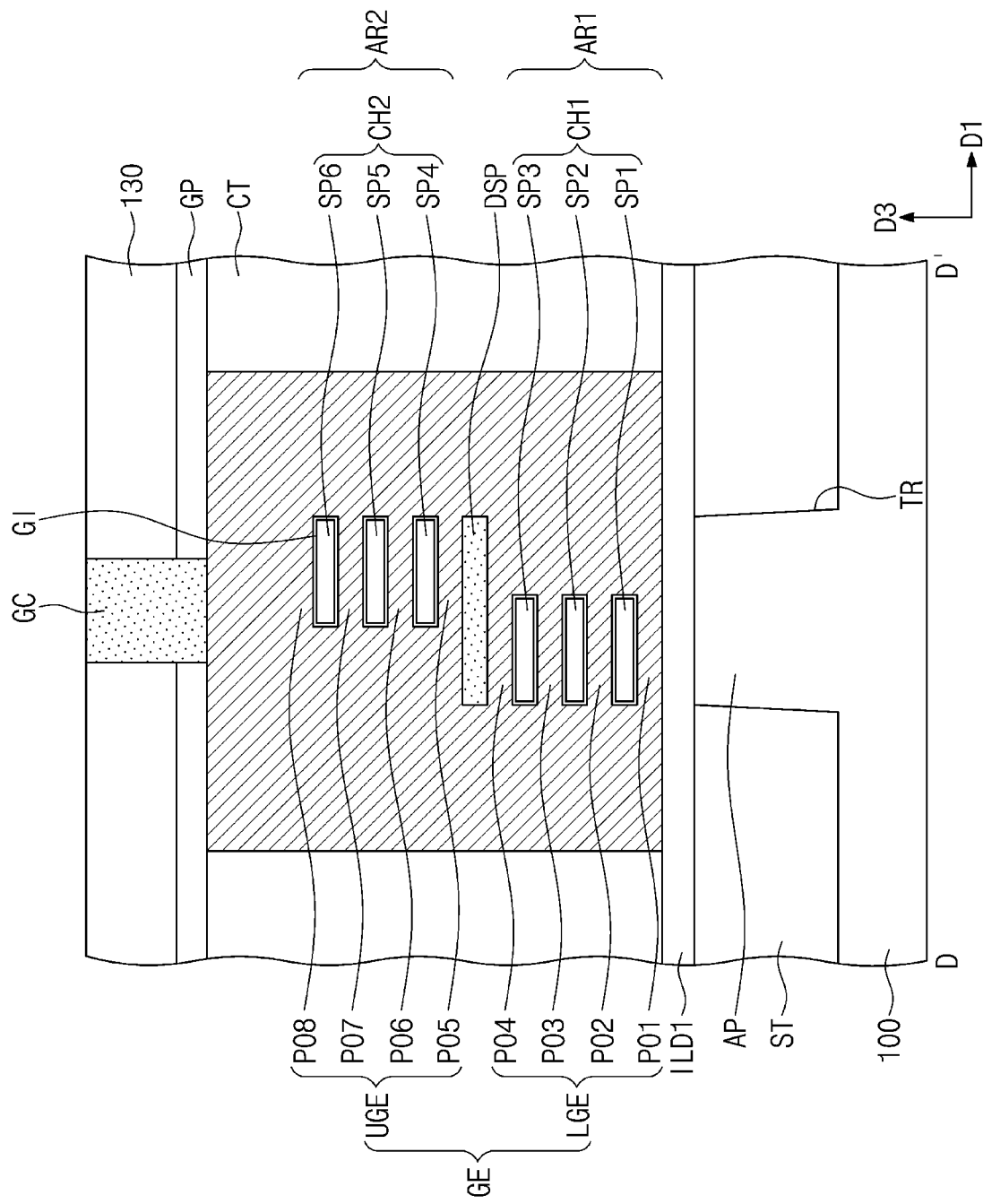
FIG. 22 illustrates a cross-sectional views taken along line D-D' of FIG. 3, showing a three-dimensional semiconductor device according to some embodiments.

FIG. 22 illustrates a cross-sectional views taken along line D-D' of FIG. 3, showing a three-dimensional semiconductor device according to some embodiments. In the embodiment that follows, a detailed description of technical features repetitive to those discussed above with reference to FIGS. 3 and 4A to 4D will be omitted, and a difference thereof will be discussed in detail.

Referring to FIG. 22, a gate dielectric layer GI may be conformally formed on the first to sixth semiconductor patterns SP1 to SP6. A gate electrode GE may be formed on the gate dielectric layer GI. The formation of the gate electrode GE may include forming first to fourth portions PO1 to PO4 and forming fifth to eighth portions PO5 to PO8. The gate electrode GE may include a lower gate electrode LGE provided in a lower tier of a front-end-of-line (FEOL) layer or in the first active region AR1, and may also include an upper gate electrode UGE provided in an upper tier of the FEOL layer or in the second active region AR2. The lower gate electrode LGE and the upper gate electrode UGE may vertically overlap each other. For example, the gate electrode GE according to the present embodiment may be a common gate electrode in which the lower gate electrode LGE on the lower channel pattern CH1 is connected to the upper gate electrode UGE on the upper channel pattern CH2.

According to an embodiment, the three-dimensional semiconductor device shown in FIG. 22 may form a CMOS device for an inverter circuit in which the common gate electrode GE receives a common gate input signal for a PMOS at an upper tier and an NMOS at a lower tier, and drain terminals of the PMOS and the NMOS, that is, the lower and upper source/drain patterns SD1 and SD2, may be connected to a common output node of the CMOS device. In this case, to connect the lower and upper source/drain pattern SD1 and SD2 to the common output node, only one active contact, that is, the first active contact AC1, may be formed such that the first active contact AC1 is extended down from the wiring lines in the FEOL of the three-dimensional semiconductor device to contact a left side edge (or surface), opposite to the fourth edge portion EG4 (right side edge or surface) of the upper source/drain pattern SD2, and contact at least one of the first edge portion EG1 and a top portion or surface of the lower source/drain pattern SD1. Thus, the second active contact AC2 may not need to be formed for the connection of the upper source/drain pattern SD2.

In the present embodiments, device density may increase by providing a three-dimensional device in which an NMOS and a PMOS are vertically stacked. In the present inventive concepts, source/drain terminals of the stacked NMOS and PMOS may be selectively connected to corresponding active contacts that are formed not horizontally but vertically. Thus, a three-dimensional device may reduce a process difficulty in forming the active contacts and increase device density and reliability as well as process efficiency. In addition, a lower source/drain terminal (pattern) may be formed to have a same width as that of an upper source/drain terminal (pattern), such that a gate pitch may be adjusted. Accordingly, the three-dimensional device may increase device reliability and reduce degradation in electrical property distribution that may occur because of a difference in width between the upper and lower source/drain terminals.

In the above embodiments of the three-dimensional semiconductor devices, the PMOS and the NMOS are formed at the upper tier and the lower tier. However, the disclosure is not limited thereto. According to an embodiment, the NMOS may be formed at the upper tier while the PMOS is formed at the lower tier.

Although the disclosure has been described in connection with the some example embodiments illustrated in the accompanying drawings, it will be understood by one of ordinary skill in the art that variations in form and detail may be made therein without departing from the spirit and scope of the disclosure. The above disclosed embodiments should thus be considered illustrative and not restrictive.

What is claimed is:

1. A three-dimensional semiconductor device comprising:
a first active region on a substrate, the first active region comprising a lower channel pattern and a lower source/drain pattern connected to the lower channel pattern;
a second active region above the first active region, the second active region comprising an upper channel pattern and an upper source/drain pattern connected to the upper channel pattern;
at least one gate electrode on the lower and upper channel patterns;
a first active contact electrically connected to the lower source/drain pattern; and
a second active contact electrically connected to the upper source/drain pattern,
wherein a first central line of the lower source/drain pattern and a second central line of the upper source/drain pattern in a vertical direction are offset from each other in a first direction perpendicular to the vertical direction,
wherein the first active contact and the second active contact are spaced apart from each other in the first direction, and
wherein a third central line of the lower channel pattern and a fourth central line of the upper channel pattern in the vertical direction are offset from each other in the first direction, and wherein the lower channel pattern and the upper channel pattern have a substantially equal width in the first direction.

2. The device of claim 1, wherein the first central line and the third central line are located at a same position, and
wherein the second central line and the fourth central line are located at a same position.

3. The device of claim 1, wherein a first portion of the upper channel pattern and a second portion of the lower channel pattern vertically overlap each other, and
wherein a second portion of the upper channel pattern and a first portion of the lower channel pattern do not vertically overlap each other.

4. The device of claim 1, wherein a first portion of the upper source/drain pattern and a second portion of the lower source/drain pattern vertically overlap each other, and
wherein a second portion of the upper source/drain pattern and a first portion of the lower source/drain pattern do not vertically overlap each other.

5. The device of claim 1, wherein the lower source/drain pattern and the upper source/drain pattern have a substantially equal width in the first direction.

6. The device of claim 1, further comprising:
a first interlayer dielectric layer on the lower source/drain pattern; and
a second interlayer dielectric layer on the upper source/drain pattern,
wherein the first active contact extends from a top surface of the second interlayer dielectric layer through the first and second interlayer dielectric layers to the lower source/drain pattern,
wherein the first active contact is positioned opposite to the second central line with respect to the first central line, and is not connected to the upper source/drain pattern,
wherein the second active contact extends from the top surface of the second interlayer dielectric layer through the second interlayer dielectric layer to the upper source/drain pattern, and
wherein the second active contact is positioned opposite to the first central line with respect to the second central line, and is not connected to the lower source/drain pattern.

7. The device of claim 1, wherein a bottom surface of the first active contact is located at a level lower than a bottom surface of the second active contact,
wherein the level of the bottom surface of the first active contact is located between bottom and top surfaces of the lower source/drain pattern, and
wherein the level of the bottom surface of the second active contact is located between bottom and top surfaces of the upper source/drain pattern.

8. The device of claim 7, wherein the first active contact is connected to a left side edge of the lower source/drain pattern, and
wherein the second active contact is connected to a right side edge of the upper source/drain pattern.

9. The device of claim 7, wherein the first active contact is connected to at least one of a left side edge or a top surface of the lower source/drain pattern, and
wherein the second active contact is connected to at least one of a right side edge or a top surface of the upper source/drain pattern.

10. The device of claim 1, wherein each of the lower and upper channel patterns comprises a plurality of semiconductor patterns that are vertically stacked and spaced apart from each other,
wherein the gate electrode comprises a first gate electrode and a second gate electrode,
wherein the first gate electrode surrounds the plurality of semiconductor patterns of the lower channel pattern, and
wherein the second gate electrode surrounds the plurality of semiconductor patterns of the upper channel pattern.

11. The device of claim 1, further comprising wiring lines on the first and second active contacts,
wherein the wiring lines are electrically connected to the first and second active contacts.

12. The device of claim 11, wherein the first and the second active contacts are extended straight down from the wiring lines and connected to the lower and upper source/drain patterns, respectively.

13. A three-dimensional semiconductor device comprising:
a substrate comprising an active pattern;
a lower source/drain pattern on the active pattern;
an upper source/drain pattern above the lower source/drain pattern, the upper source/drain pattern being vertically spaced apart from the lower source/drain pattern, and a first portion of the upper source/drain pattern and a second portion of the lower source/drain pattern vertically overlapping each other while a second portion of the upper source/drain pattern and a first portion of the lower source/drain pattern not vertically overlapping each other;
a first interlayer dielectric layer on the lower source/drain pattern and a second interlayer dielectric layer on the upper source/drain pattern;
a first active contact that vertically extends from a top surface of the second interlayer dielectric layer through the first and second interlayer dielectric layers to the lower source/drain pattern; and
a second active contact that vertically extends from the top surface of the second interlayer dielectric layer through the second interlayer dielectric layer to the upper source/drain pattern, wherein a first central line of the lower source/drain pattern and a second central line of the upper source/drain pattern in a vertical direction are offset from each other in a first direction perpendicular to the vertical direction, wherein the first active contact and the second active contact are spaced apart from each other in the first direction, wherein the first active contact is insulated from the upper source/drain pattern, and is electrically connected to the lower source/drain pattern, and wherein the second active contact is insulated from the lower source/drain pattern, and is electrically connected to the upper source/drain pattern.

14. The device of claim 13, further comprising:
a lower channel pattern connected to the lower source/drain pattern, and an upper channel pattern connected to the upper source/drain pattern, the upper channel pattern being spaced apart from the lower channel pattern, and a first portion of the upper channel pattern and a second portion of the lower channel pattern vertically overlapping each other, while a second portion of the upper channel pattern and a first portion of the lower channel pattern not vertically overlapping each other; and
at least one gate electrode on the lower and upper channel patterns,
wherein a third central line of the lower channel pattern and a fourth central line of the upper channel pattern in the vertical direction are offset from each other in the first direction, and
wherein the lower channel pattern and the upper channel pattern have an equal width in the first direction.

15. The device of claim 14, wherein each of the lower and upper channel patterns comprises a plurality of semiconductor patterns that are vertically stacked and spaced apart from each other,
wherein the gate electrode comprises a first gate electrode and a second gate electrode,
wherein the first gate electrode surrounds the plurality of semiconductor patterns of the lower channel pattern, and
wherein the second gate electrode surrounds the plurality of semiconductor patterns of the upper channel pattern.

16. A three-dimensional semiconductor device comprising:
lower source/drain patterns connected to each other through a lower channel pattern; and
upper source/drain patterns, above the lower source/drain patterns, connected to each other through an upper channel pattern,
wherein the lower channel pattern and the upper channel pattern have an equal width in a first direction,
wherein a first central line of the lower channel pattern and a second central line of the upper channel pattern in a vertical direction, perpendicular to the first direction, do not overlap each other,
wherein at least one of the lower source/drain patterns and at least one of the upper source/drain patterns above the lower source/drain pattern have an equal width in the first direction, and
wherein a third central line of the lower source/drain pattern and a fourth central line of the upper source/drain pattern in the vertical direction do not overlap each other.

17. The three-dimensional semiconductor device of claim 16, further comprising a first active contact connecting a front-end-of-line (FEOL) structure to the lower source/drain pattern,
wherein the first active contact is connected to at least one of a side edge portion or a top portion of the lower source/drain pattern.

18. The three-dimensional semiconductor device of claim 17, wherein the first active contact is connected to at least a side edge portion of the upper source/drain pattern.

* * * * *